(12) United States Patent
Miles et al.

(10) Patent No.: US 7,781,850 B2
(45) Date of Patent: Aug. 24, 2010

(54) CONTROLLING ELECTROMECHANICAL BEHAVIOR OF STRUCTURES WITHIN A MICROELECTROMECHANICAL SYSTEMS DEVICE

(75) Inventors: Mark W. Miles, San Francisco, CA (US); John Batey, Cupertino, CA (US); Clarence Chui, San Mateo, CA (US); Manish Kothari, Cupertino, CA (US); Ming-Hau Tung, San Francisco, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 146 days.

(21) Appl. No.: 11/090,911

(22) Filed: Mar. 25, 2005

(65) Prior Publication Data
US 2005/0250235 A1 Nov. 10, 2005

Related U.S. Application Data

(63) Continuation-in-part of application No. 10/251,196, filed on Sep. 20, 2002.

(60) Provisional application No. 60/613,466, filed on Sep. 27, 2004.

(51) Int. Cl.
*H01L 27/14* (2006.01)
(52) U.S. Cl. .................. 257/414; 257/428; 257/437
(58) Field of Classification Search .............. 257/414, 257/428, 437
See application file for complete search history.

(56) References Cited

U.S. PATENT DOCUMENTS

| | | | |
|---|---|---|---|
| 2,534,846 A | 12/1950 | Ambrose et al. | |
| 3,439,973 A | 4/1969 | Paul et al. | |
| 3,443,854 A | 5/1969 | Weiss | |
| 3,616,312 A | 10/1971 | McGriff et al. | |
| 3,653,741 A | 4/1972 | Marks | |
| 3,656,836 A | 4/1972 | de Cremoux et al. | |
| 3,725,868 A | 4/1973 | Malmer, Jr. et al. | |
| 3,813,265 A | 5/1974 | Marks | |
| 3,955,880 A | 5/1976 | Lierke | |
| 4,099,854 A | 7/1978 | Decker et al. | |
| 4,196,396 A | 4/1980 | Smith | |
| 4,228,437 A | 10/1980 | Shelton | |

(Continued)

FOREIGN PATENT DOCUMENTS

CH 680534 9/1992

(Continued)

OTHER PUBLICATIONS

Austrian Search Report for EX72/2005 dated May 13, 2005.

(Continued)

*Primary Examiner*—Kenneth A Parker
*Assistant Examiner*—Jose R Diaz
(74) *Attorney, Agent, or Firm*—Knobbe Martens Olson & Bear LLP

(57) ABSTRACT

In one embodiment, the invention provides a method for fabricating a microelectromechanical systems device. The method comprises fabricating a first layer comprising a film having a characteristic electromechanical response, and a characteristic optical response, wherein the characteristic optical response is desirable and the characteristic electromechanical response is undesirable; and modifying the characteristic electromechanical response of the first layer by at least reducing charge build up thereon during activation of the microelectromechanical systems device.

11 Claims, 15 Drawing Sheets

U.S. PATENT DOCUMENTS

| | | |
|---|---|---|
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagiri et al. |
| 4,863,245 A | 9/1989 | Roxlo |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,512 A | 5/1994 | Allman et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,439,763 A | 8/1995 | Akira et al. |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |

| | | | | | | |
|---|---|---|---|---|---|---|
| 5,610,624 | A | 3/1997 | Bhuva | 6,195,196 | B1 | 2/2001 | Kimura et al. |
| 5,610,625 | A | 3/1997 | Sampsell | 6,201,633 | B1 | 3/2001 | Peeters et al. |
| 5,619,059 | A | 4/1997 | Li et al. | 6,204,080 | B1 | 3/2001 | Hwang |
| 5,619,365 | A | 4/1997 | Rhoades et al. | 6,232,936 | B1 | 5/2001 | Gove et al. |
| 5,619,366 | A | 4/1997 | Rhoads et al. | 6,243,149 | B1 | 6/2001 | Swanson et al. |
| 5,622,814 | A | 4/1997 | Miyata et al. | 6,246,398 | B1 | 6/2001 | Koo |
| 5,629,790 | A | 5/1997 | Neukermans et al. | 6,249,039 | B1 | 6/2001 | Harvey et al. |
| 5,633,652 | A | 5/1997 | Kanbe et al. | 6,275,220 | B1 | 8/2001 | Nitta |
| 5,636,052 | A | 6/1997 | Arney et al. | 6,282,010 | B1 | 8/2001 | Sulzbach et al. |
| 5,636,185 | A | 6/1997 | Brewer et al. | 6,284,560 | B1 | 9/2001 | Jech et al. |
| 5,638,084 | A | 6/1997 | Kalt | 6,288,824 | B1 | 9/2001 | Kastalsky et al. |
| 5,638,946 | A | 6/1997 | Zavracky | 6,295,154 | B1 | 9/2001 | Laor et al. |
| 5,641,391 | A | 6/1997 | Hunter et al. | 6,323,982 | B1 | 11/2001 | Hornbeck |
| 5,646,768 | A | 7/1997 | Kaeiyama | 6,327,071 | B1 | 12/2001 | Kimura |
| 5,647,819 | A | 7/1997 | Fujita et al. | 6,329,297 | B1 | 12/2001 | Balish et al. |
| 5,650,834 | A | 7/1997 | Nakagawa et al. | 6,335,831 | B2 | 1/2002 | Kowarz et al. |
| 5,650,881 | A | 7/1997 | Hornbeck | 6,340,435 | B1 | 1/2002 | Bjorkman et al. |
| 5,654,741 | A | 8/1997 | Sampsell et al. | 6,351,329 | B1 | 2/2002 | Greywall |
| 5,657,099 | A | 8/1997 | Doherty et al. | 6,356,254 | B1 | 3/2002 | Kimura |
| 5,659,374 | A | 8/1997 | Gale, Jr. et al. | 6,376,787 | B1 | 4/2002 | Martin et al. |
| 5,665,997 | A | 9/1997 | Weaver et al. | 6,391,675 | B1 | 5/2002 | Ehmke et al. |
| 5,673,139 | A | 9/1997 | Johnson | 6,392,233 | B1 | 5/2002 | Channin et al. |
| 5,674,757 | A | 10/1997 | Kim | 6,392,781 | B1 | 5/2002 | Kim et al. |
| 5,683,591 | A | 11/1997 | Offenberg | 6,407,851 | B1 | 6/2002 | Islam et al. |
| 5,703,710 | A | 12/1997 | Brinkman et al. | 6,424,094 | B1 | 7/2002 | Feldman |
| 5,706,022 | A | 1/1998 | Hato | 6,446,486 | B1 | 9/2002 | deBoer et al. |
| 5,710,656 | A | 1/1998 | Goossen | 6,447,126 | B1 | 9/2002 | Hornbeck |
| 5,726,480 | A | 3/1998 | Pister | 6,449,084 | B1 | 9/2002 | Guo |
| 5,739,945 | A | 4/1998 | Tayebati | 6,452,124 | B1 * | 9/2002 | York et al. ............ 200/181 |
| 5,745,193 | A | 4/1998 | Urbanus et al. | 6,452,465 | B1 | 9/2002 | Brown et al. |
| 5,745,281 | A | 4/1998 | Yi et al. | 6,456,420 | B1 | 9/2002 | Goodwin-Johansson |
| 5,771,116 | A | 6/1998 | Miller et al. | 6,465,355 | B1 | 10/2002 | Horsley |
| 5,771,321 | A | 6/1998 | Stern | 6,466,354 | B1 | 10/2002 | Gudeman |
| 5,784,190 | A | 7/1998 | Worley | 6,466,358 | B2 | 10/2002 | Tew |
| 5,784,212 | A | 7/1998 | Hornbeck | 6,473,274 | B1 | 10/2002 | Maimone et al. |
| 5,793,504 | A | 8/1998 | Stoll | 6,480,177 | B2 | 11/2002 | Doherty et al. |
| 5,808,780 | A | 9/1998 | McDonald | 6,496,122 | B2 | 12/2002 | Sampsell |
| 5,818,095 | A | 10/1998 | Sampsell | 6,513,911 | B1 | 2/2003 | Ozaki et al. |
| 5,822,170 | A | 10/1998 | Cabuz et al. | 6,522,801 | B1 | 2/2003 | Aksyuk et al. |
| 5,824,608 | A | 10/1998 | Gotoch et al. | 6,531,945 | B1 | 3/2003 | Ahn et al. |
| 5,825,528 | A | 10/1998 | Goosen | 6,537,427 | B1 | 3/2003 | Raina et al. |
| 5,835,255 | A | 11/1998 | Miles | 6,545,335 | B1 | 4/2003 | Chua et al. |
| 5,838,484 | A | 11/1998 | Goossen et al. | 6,548,908 | B2 | 4/2003 | Chua et al. |
| 5,842,088 | A | 11/1998 | Thompson | 6,549,195 | B2 | 4/2003 | Hikida et al. |
| 5,867,302 | A | 2/1999 | Fleming et al. | 6,549,338 | B1 | 4/2003 | Wolverton et al. |
| 5,912,758 | A | 6/1999 | Knipe et al. | 6,552,840 | B2 | 4/2003 | Knipe |
| 5,943,158 | A | 8/1999 | Ford et al. | 6,567,312 | B1 | 5/2003 | Torii |
| 5,945,980 | A | 8/1999 | Moissey et al. | 6,574,033 | B1 | 6/2003 | Chui et al. |
| 5,959,763 | A | 9/1999 | Bozler et al. | 6,577,785 | B1 | 6/2003 | Spahn et al. |
| 5,972,193 | A | 10/1999 | Chou et al. | 6,589,625 | B1 | 7/2003 | Kothari et al. |
| 5,976,902 | A | 11/1999 | Shih | 6,600,201 | B2 | 7/2003 | Hartwell et al. |
| 5,986,796 | A | 11/1999 | Miles | 6,606,175 | B1 | 8/2003 | Sampsell et al. |
| 5,994,174 | A | 11/1999 | Carey et al. | 6,608,268 | B1 | 8/2003 | Goldsmith |
| 6,016,693 | A | 1/2000 | Viani et al. | 6,610,440 | B1 | 8/2003 | LaFollette et al. |
| 6,028,690 | A | 2/2000 | Carter et al. | 6,625,047 | B2 | 9/2003 | Coleman, Jr. |
| 6,038,056 | A | 3/2000 | Florence et al. | 6,630,786 | B2 | 10/2003 | Cummings et al. |
| 6,040,937 | A | 3/2000 | Miles | 6,632,698 | B2 | 10/2003 | Ives |
| 6,049,317 | A | 4/2000 | Thompson et al. | 6,635,919 | B1 | 10/2003 | Melendez et al. |
| 6,055,090 | A | 4/2000 | Miles | 6,642,913 | B1 | 11/2003 | Kimura et al. |
| 6,057,903 | A | 5/2000 | Colgan et al. | 6,643,069 | B2 | 11/2003 | Dewald |
| 6,061,075 | A | 5/2000 | Nelson et al. | 6,650,455 | B2 | 11/2003 | Miles |
| 6,099,132 | A | 8/2000 | Kaeriyama | 6,657,832 | B2 | 12/2003 | Williams et al. |
| 6,100,477 | A * | 8/2000 | Randall et al. .......... 200/181 | 6,660,656 | B2 | 12/2003 | Cheung et al. |
| 6,100,872 | A | 8/2000 | Aratani et al. | 6,666,561 | B1 | 12/2003 | Blakley |
| 6,113,239 | A | 9/2000 | Sampsell et al. | 6,674,033 | B1 | 1/2004 | Wang |
| 6,115,326 | A | 9/2000 | Puma et al. | 6,674,562 | B1 | 1/2004 | Miles et al. |
| 6,147,790 | A | 11/2000 | Meier et al. | 6,680,792 | B2 | 1/2004 | Miles |
| 6,158,156 | A | 12/2000 | Patrick | 6,687,896 | B1 | 2/2004 | Royce et al. |
| 6,160,833 | A | 12/2000 | Floyd et al. | 6,710,908 | B2 | 3/2004 | Miles et al. |
| 6,166,422 | A | 12/2000 | Qian et al. | 6,720,267 | B1 | 4/2004 | Chen et al. |
| 6,171,945 | B1 | 1/2001 | Mandal et al. | 6,736,987 | B1 | 5/2004 | Cho |
| 6,180,428 | B1 | 1/2001 | Peeters et al. | 6,741,377 | B2 | 5/2004 | Miles |
| 6,194,323 | B1 | 2/2001 | Downey et al. | 6,741,384 | B1 | 5/2004 | Martin et al. |

| | | |
|---|---|---|
| 6,741,503 B1 | 5/2004 | Farris et al. |
| 6,743,570 B2 | 6/2004 | Harnett et al. |
| 6,747,785 B2 | 6/2004 | Chen et al. |
| 6,747,800 B1 | 6/2004 | Lin |
| 6,756,317 B2 | 6/2004 | Sniegowski et al. |
| 6,768,097 B1 | 7/2004 | Viktorovitch et al. |
| 6,775,174 B2 | 8/2004 | Huffman et al. |
| 6,778,155 B2 | 8/2004 | Doherty et al. |
| 6,778,306 B2 | 8/2004 | Sniegowski et al. |
| 6,791,441 B2 * | 9/2004 | Pillans et al. .................. 335/78 |
| 6,794,119 B2 | 9/2004 | Miles |
| 6,803,534 B1 | 10/2004 | Chen et al. |
| 6,809,788 B2 | 10/2004 | Yamada et al. |
| 6,811,267 B1 | 11/2004 | Allen et al. |
| 6,812,482 B2 | 11/2004 | Fleming et al. |
| 6,819,469 B1 | 11/2004 | Koba |
| 6,822,628 B2 | 11/2004 | Dunphy et al. |
| 6,829,132 B2 | 12/2004 | Martin et al. |
| 6,853,129 B1 | 2/2005 | Cummings et al. |
| 6,855,610 B2 | 2/2005 | Tung et al. |
| 6,858,080 B2 | 2/2005 | Linares et al. |
| 6,859,218 B1 | 2/2005 | Luman et al. |
| 6,859,301 B1 | 2/2005 | Islam et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,905,621 B2 | 6/2005 | Ho et al. |
| 6,906,847 B2 | 6/2005 | Huibers et al. |
| 6,912,022 B2 | 6/2005 | Lin et al. |
| 6,940,631 B2 | 9/2005 | Ishikawa |
| 6,947,200 B2 | 9/2005 | Huibers |
| 6,952,303 B2 | 10/2005 | Lin et al. |
| 6,952,304 B2 | 10/2005 | Mushika et al. |
| 6,958,847 B2 | 10/2005 | Lin |
| 6,980,350 B2 | 12/2005 | Hung et al. |
| 6,982,820 B2 | 1/2006 | Tsai |
| 6,995,890 B2 | 2/2006 | Lin |
| 6,999,225 B2 | 2/2006 | Lin |
| 6,999,236 B2 | 2/2006 | Lin |
| 7,550,794 B2 | 6/2009 | Miles et al. |
| 2001/0003487 A1 | 6/2001 | Miles |
| 2001/0026951 A1 | 10/2001 | Vergani et al. |
| 2001/0040649 A1 | 11/2001 | Ozaki |
| 2001/0040675 A1 | 11/2001 | True et al. |
| 2002/0015215 A1 | 2/2002 | Miles |
| 2002/0021485 A1 | 2/2002 | Pilossof |
| 2002/0024711 A1 | 2/2002 | Miles |
| 2002/0027636 A1 | 3/2002 | Yamada |
| 2002/0036304 A1 | 3/2002 | Ehmke et al. |
| 2002/0054424 A1 | 5/2002 | Miles |
| 2002/0055253 A1 | 5/2002 | Rudhard |
| 2002/0070931 A1 | 6/2002 | Ishikawa |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0126364 A1 | 9/2002 | Miles |
| 2002/0137072 A1 | 9/2002 | Mirkin et al. |
| 2002/0149828 A1 | 10/2002 | Miles |
| 2002/0149850 A1 | 10/2002 | Heffner et al. |
| 2002/0167072 A1 | 11/2002 | Andosca |
| 2002/0168136 A1 | 11/2002 | Atia et al. |
| 2002/0171610 A1 | 11/2002 | Siwinski et al. |
| 2002/0186209 A1 | 12/2002 | Cok |
| 2002/0195681 A1 * | 12/2002 | Melendez et al. ........... 257/528 |
| 2003/0006468 A1 | 1/2003 | Ma et al. |
| 2003/0043157 A1 | 3/2003 | Miles |
| 2003/0053078 A1 | 3/2003 | Missey et al. |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0112096 A1 | 6/2003 | Potter |
| 2003/0118920 A1 | 6/2003 | Johnstone et al. |
| 2003/0138213 A1 | 7/2003 | Jin et al. |
| 2003/0152872 A1 | 8/2003 | Miles |
| 2003/0164350 A1 | 9/2003 | Hanson et al. |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0231373 A1 | 12/2003 | Kowarz et al. |
| 2004/0010115 A1 | 1/2004 | Sotzing |
| 2004/0027636 A1 | 2/2004 | Miles |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0051929 A1 | 3/2004 | Sampsell et al. |
| 2004/0053434 A1 | 3/2004 | Bruner |
| 2004/0058531 A1 | 3/2004 | Miles et al. |
| 2004/0058532 A1 | 3/2004 | Miles et al. |
| 2004/0061543 A1 | 4/2004 | Nam et al. |
| 2004/0063322 A1 | 4/2004 | Yang |
| 2004/0080807 A1 | 4/2004 | Chen et al. |
| 2004/0080832 A1 | 4/2004 | Singh |
| 2004/0087086 A1 | 5/2004 | Lee |
| 2004/0100677 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136076 A1 | 7/2004 | Tayebati |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0012577 A1 | 1/2005 | Pillans et al. |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046922 A1 | 3/2005 | Lin et al. |
| 2005/0046948 A1 | 3/2005 | Lin |
| 2005/0057442 A1 | 3/2005 | Way |

| | | | |
|---|---|---|---|
| 2005/0068583 A1 | 3/2005 | Gutkowski et al. | |
| 2005/0068605 A1 | 3/2005 | Tsai | |
| 2005/0068606 A1 | 3/2005 | Tsai | |
| 2005/0069209 A1 | 3/2005 | Damera-Venkata et al. | |
| 2005/0078348 A1 | 4/2005 | Lin | |
| 2005/0168849 A1 | 8/2005 | Lin | |
| 2005/0195462 A1 | 9/2005 | Lin | |
| 2005/0195467 A1 | 9/2005 | Kothari et al. | |
| 2005/0202649 A1 | 9/2005 | Hung et al. | |
| 2006/0066932 A1 | 3/2006 | Chui | |

FOREIGN PATENT DOCUMENTS

| | | |
|---|---|---|
| CH | 681 047 | 12/1992 |
| CN | 092109265 | 11/2003 |
| DE | 10228946 A1 | 1/2004 |
| EP | 0173808 | 3/1986 |
| EP | 0 667 548 A1 | 8/1995 |
| EP | 0694801 A | 1/1996 |
| EP | 0 695 959 | 2/1996 |
| EP | 0 878 824 A2 | 11/1998 |
| EP | 1 170 618 | 1/2002 |
| EP | 1 197 778 | 4/2002 |
| EP | 1 243 550 | 9/2002 |
| EP | 1258860 A1 | 11/2002 |
| EP | 1 452 481 A | 9/2004 |
| JP | 5-49238 | 2/1993 |
| JP | 405275401 A | 10/1993 |
| JP | 06-281956 | 10/1994 |
| JP | 09-33942 | 7/1997 |
| JP | 10-020328 | 1/1998 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-28938 | 1/2000 |
| JP | 2000-40831 A | 2/2000 |
| JP | 2001-272613 | 10/2001 |
| JP | 2002 062493 | 2/2002 |
| JP | 2002-270575 | 9/2002 |
| JP | 2002-296521 | 10/2002 |
| JP | 2002-341267 | 11/2002 |
| JP | 2002-355800 | 12/2002 |
| JP | 2003001598 A | 1/2003 |
| JP | 2003-057571 | 2/2003 |
| JP | 2003195201 | 7/2003 |
| JP | 2004-102022 A | 4/2004 |
| JP | 2004106074 A | 4/2004 |
| JP | 2004-212656 | 7/2004 |
| JP | 2005051007 A | 2/2005 |
| KR | 2002-9270 | 10/1999 |
| KR | 2000-0033006 | 6/2000 |
| TW | 157313 | 5/1991 |
| WO | WO 92/10925 | 6/1992 |
| WO | WO 95/30924 | 11/1995 |
| WO | WO9717628 | 5/1997 |
| WO | WO 99/34484 | 7/1999 |
| WO | WO 99/52006 | 10/1999 |
| WO | WO0114248 | 3/2001 |
| WO | WO03007049 A1 | 1/2003 |
| WO | WO 02/24570 | 3/2003 |
| WO | WO 03/046508 | 6/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO 2004/000717 | 12/2003 |
| WO | WO2004006003 A1 | 1/2004 |
| WO | WO 2004/015741 | 2/2004 |
| WO | WO2004026757 A2 | 4/2004 |
| WO | WO 2005/019899 A1 | 3/2005 |
| WO | WO 2005/085932 | 9/2005 |
| WO | WO 2006/036385 | 4/2006 |
| WO | WO 2006/036437 | 4/2006 |
| WO | WO2006/036542 | 4/2006 |

OTHER PUBLICATIONS

Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Crouse, "Self-ordered pore structure of anodized aluminum on silicon and pattern transfer" Applied Physics Letters, vol. 76, No. 1, Jan. 3, 2000. pp. 49-51.
French, P.J. "Development of Surface Micromachining techniques compatable with on-chip electronics" Journal of Micromechanics and Microengineering vol. 6 No. 2, 197-211 XP 002360789 Jun. 1996 IOP Publishing.
Furneaux, et al. "The Formation of Controlled-porosity membranes from Anodically Oxidized Aluminum" Nature vo 337 Jan. 12, 1989, pp. 147-149.
Jerman J. H. et al., "Maniature Fabry-Perot Interferometers Micromachined in Silicon for Use in Optical Fiber WDM Systems," Transducers. San Francisco, Jun. 24-27, 1991, Proceedings of the International Conference on Solid State Sensors Andactuators, New Youk IEEE, US, vol. Conf. 6, Jun. 24, 1991.
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Maboudian, et al. Critical Review: Adhesion in Surface Micromechanical Structures: J. Vac. Sci Techno. B 15(1) Jan./Feb. 1997, pp. 1-20.
MICROCHEM, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).
Penta Vacuum MEMS Etcher Specifications, http://www.pentavacuum.com/memes.htm.
Science and Technology, The Economist, pp. 89-90, (May 1999).
Search Report PCT/US05/031237 (Dec. 29, 2005).
Search Report PCT/US05/030033 and Written Opinion.
Searh Report PCT/US05/030902.
Search Report and Written Opinion for PCT/US05/33558 (May 19, 2005).
Search Report PCT/US05/032331 (Apr. 7, 2006).
Search Report PCT/US05/032331 (Jan. 9, 2006).
Search Report and written opinion PCT/US05/032647.
Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).
Thin Film Transistors- Materials and Processes -vol. 1 Amorphous Silicon Thin Film Transistors ed. Yue Kuo, Kluwer Academic Publishers, Boston (2004).
Xactix Xetch X Specifications, http://xactix.com/Xtech X3specs.htm. Jan. 5, 2005.
Xactix Xetch Product information.
Akasaka, "Three-Dimensional IC Trends," Proceedings of IEEE, vol. 74, No. 12, pp. 1703-1714, (Dec. 1986).
Austrian Search Report dated May 4, 2005.

Austrian Search Report dated Aug. 12, 2005.

Aratani et al., "Surface micromachined tuneable interferometer array," Sensors and Actuators, pp. 17-23. (1994).

Conner, "Hybrid Color Display Using Optical Interference Filter Array," SID Digest, pp. 577-580 (1993).

EP 05255661.0 European Search Report (Dec. 30, 2005).

Fan et al., "Channel Drop Filters in Photonic Crystals," Optics Express, vol. 3, No. 1 (1998).

Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).

Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.

Gosch, "West Germany Grabs the Lead in X-Ray Lithography," Electronics pp. 78-80 (Feb. 5, 1987).

Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.

Howard et al., "Nanometer-Scale Fabrication Techniques," VLSI Electronics: Microstructure Science, vol. 5, pp. 145-153 and pp. 166-173 (1982).

Ibbotson et al., "Comparison of XeF2 and F-atom reactions with Si and SiO2," Applied Physics Letters, vol. 44, No. 12, pp. 1129-1131 (Jun. 1984).

Jackson "Classical Electrodynamics," John Wiley & Sons Inc., pp. 568-573. (date unknown).

Jerman et al., "A Miniature Fabry-Perot Interferometer with a Corrugated Silicon Diaphragm Support," (1988).

Joannopoulos et al., "Photonic Crystals: Molding the Flow of Light," Princeton University Press (1995).

Johnson, "Optical Scanners," Microwave Scanning Antennas, vol. 1, p. 251-261, (1964).

Kim et al., "Control of Optical Transmission Through Metals Perforated With Subwavelength Hole Arrays," Optic Letters, vol. 24, No. 4, pp. 256-257, (Feb. 1999).

Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).

Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).

Light over Matter, Circle No. 36 (Jun. 1993).

Lin et al., "Free-Space Micromachined Optical Switches for Optical Networking," IEEE Journal of Selected Topics in Quantum Electronics, vol. 5, No. 1, pp. 4-9. (Jan./Feb. 1999).

Little et al., "Vertically Coupled Microring Resonator Channel Dropping Filter," IEEE Photonics Technology Letters, vol. 11, No. 2, (1999).

Magel, "Integrated Optic Devices Using Micromachined Metal Membranes," SPIE vol. 2686, 0-8194-2060-Mar. (1996).

Miles, Mark, W., "A New Reflective FPD Technology Using Interferometric Modulation," The Proceedings of the Society for Information Display (May 11-16, 1997).

Nagami et al., "Plastic Cell Architecture: Towards Reconfigurable Computing For General-Purpose," IEEE, 0-8186-8900-, pp. 68-77, (May 1998).

Newsbreaks, "Quantum-trench devices might operate at terahertz frequencies," Laser Focus World (May 1993).

Oliner et al., "Radiating Elements and Mutual Coupling," Microwave Scanning Antennas, vol. 2, pp. 131-141, (1966).

PCT/US02/13442, Search Report Sep. 13, 2002.

PCT/US04/20330 Search Report Nov. 8, 2004.

PCT/US05/029821 International Search Report (Dec. 27, 2005).

PCT/US05/030927 International Search Report (Jan. 25, 2006).

PCT/US05/031693 International Search Report.

PCT/US05/032331 International Search Report (Apr. 7, 2006).

PCT/US05/033558 Partial International Search Report (Feb. 24, 2006).

PCT/US2004/035820 International Search Report and Written Opinion (Apr. 11, 2005).

PCT/US96/17731 Search Report.

Raley et al., "A Fabry-Perot Microinterferometer for Visible Wavelengths," IEEE Solid-State Sensor and Actuator Workshop, Jun. 1992, Hilton Head, SC.

Schnakenberg et al., "TMAHW Etchants for Silicon Micromachining," 1991 International Conference on Solid State Sensors and Actuators-Digest of Technical Papers, pp. 815-818 (1991).

Sperger et al., "High Performance Patterned All-Dielectric Interference Colour Filter for Display Applications," SID Digest, pp. 81-83, (1994).

Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory," McGraw-Hill, pp. 340-343, (1963).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

Aratani, et al., "Process and design considerations for surface micromachined beams for a tuneable interferometer array in silicon," Proceedings of the Workshop on Micro Electro Mechanical Systems (MEMS), Fort Lauderdale, FL, IEEE Catalog No. 93CH6265-6, Library of Congress No. 92-56273, (Feb. 7-10, 1993).

Office Action dated May 14, 2007 issued in parent U.S. Appl. No. 10/251,196.

Office Action dated Jun. 6, 2006 issued in parent U.S. Appl. No. 10/251,196.

Penta Vacuum Mems Etcher Specifications, www.pentavacuum.com/mems.htm (2003).

Xactix Xetch Product information. (2005).

Hall, Integrated optical inteferometric detection method for micromachined capacitiive acoustic transducers, App. Phy. Let. 80:20(3859-3961) May 20, 2002.

Matsumoto et al., Novel prevention method of stiction using silicon anodization for SOI structure, Sensors and Actuators, 72:2(153-159) Jan. 19, 1999.

Watanabe et al., Reduction of microtrenching and island formation in oxide plasma etching by employing electron beam charge neutralization, Applied Physics Letters, 79:17(2698-2700), Oct. 22, 2001.

Office Action dated Dec. 3, 2007 in U.S. Appl. No. 10/251,196.

Office Action dated Jul. 18, 2008 in U.S. Appl. No. 10/251,196.

ISR for PCT/US03/30016 dated Apr. 27, 2004.

Examiner's Report dated Feb. 26, 2008 in Australian App. No. 2003275194.

Office Action dated May 9, 2008 in Chinese App. No. 03821986.7.

Office Action dated Aug. 15, 2008 in Chinese App. No. 03821986.7.

Decision of Final Rejection dated Nov. 28, 2008 in Chinese App. No. 03821986.7.

Official Action received May 26, 2008 in Russian App. No. 2005111765.

Official Action Dated May 13, 2009 in Russian App. No. 2005111765.
Official Action dated Apr. 25, 2009 in Mexican App. No. PA/a/2005/003078.
Notice of Reasons for Rejection dated Jul. 28, 2009 in Japanese App. No. 2004-538461.
Office Action dated Nov. 14, 2008 in Chinese App. No. 200580032155.2.
Office Action dated Jan. 8, 2010 in Chinese App. No. 200580032155.2.

* cited by examiner

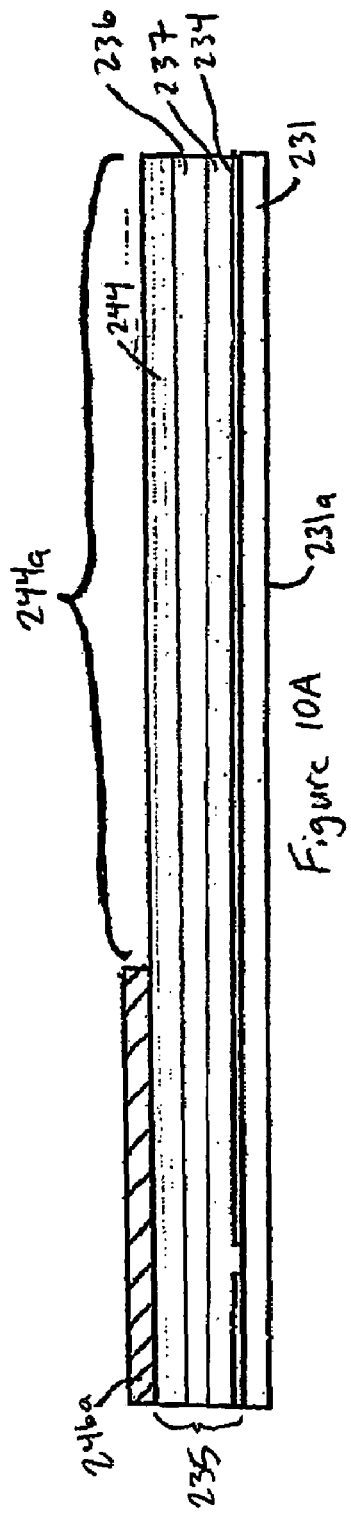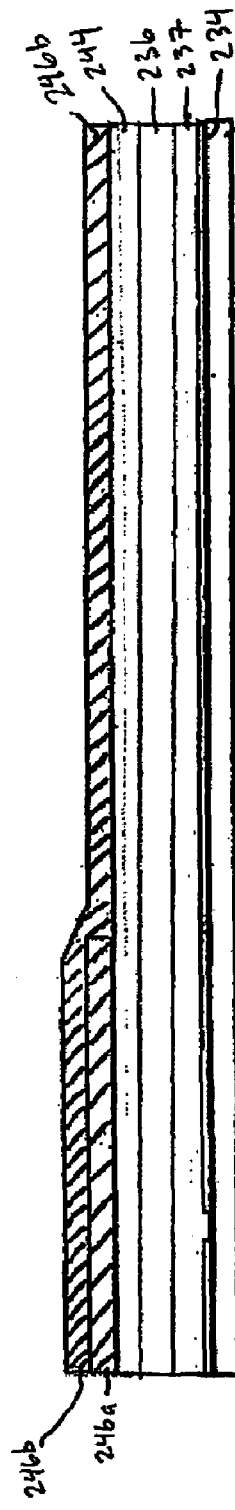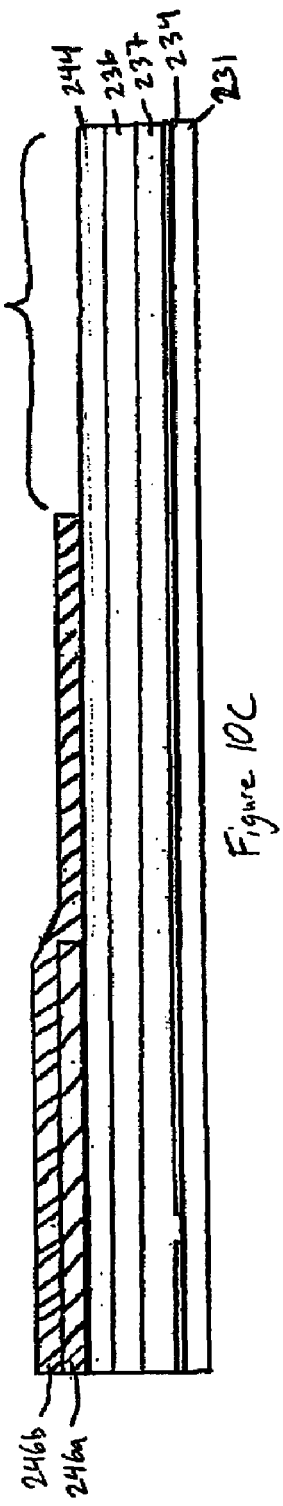

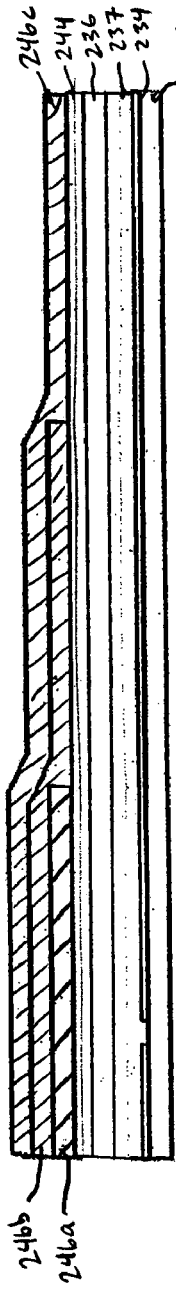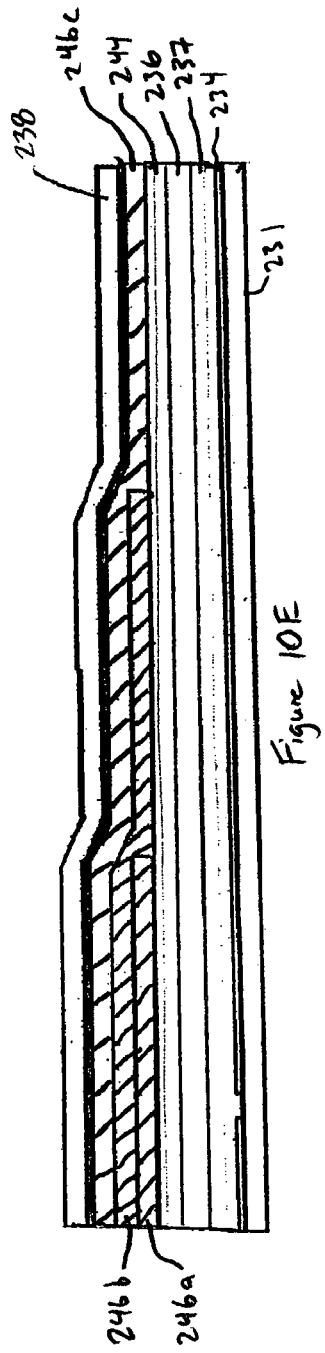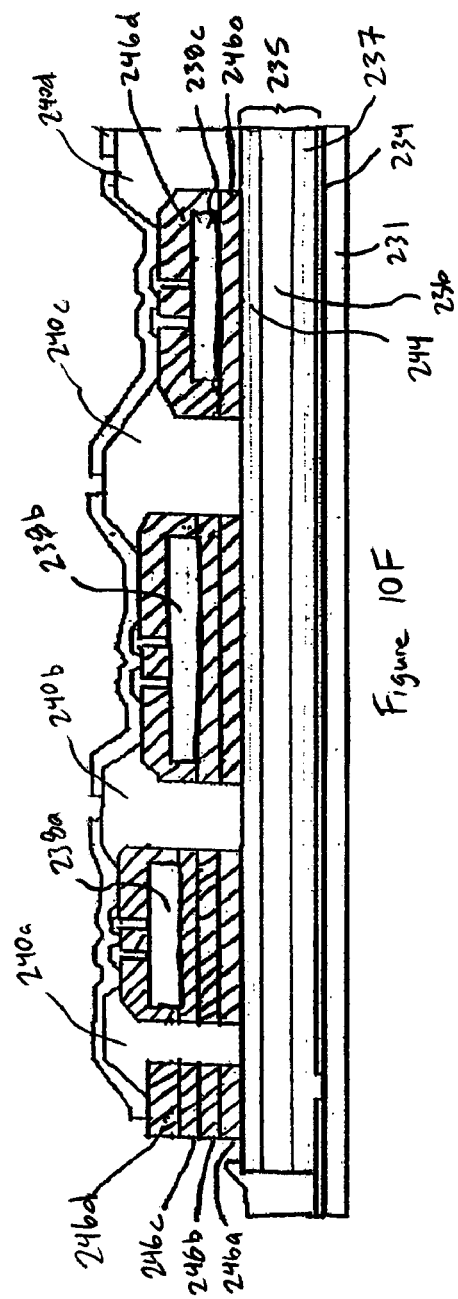

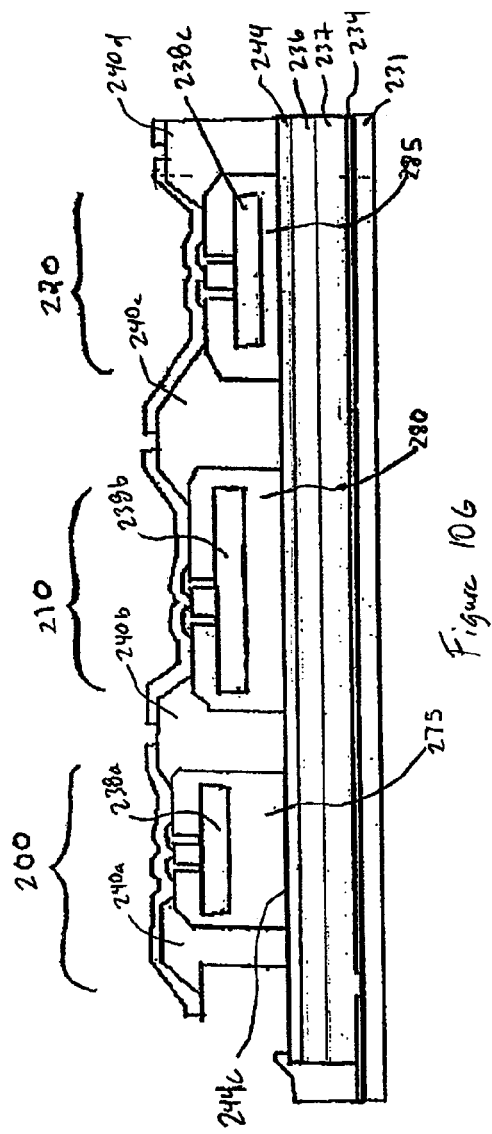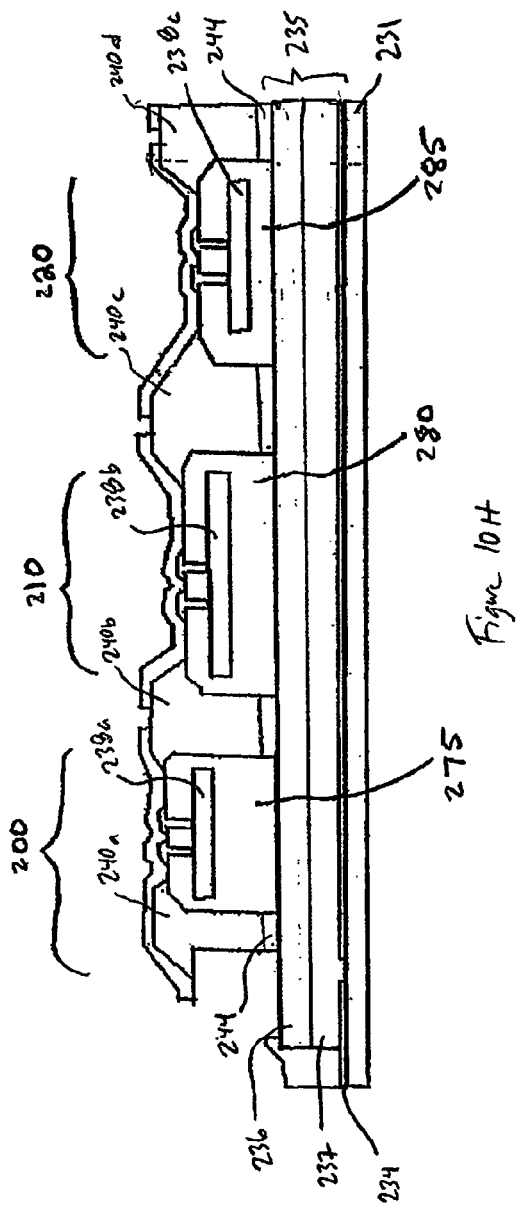

CONTROLLING ELECTROMECHANICAL BEHAVIOR OF STRUCTURES WITHIN A MICROELECTROMECHANICAL SYSTEMS DEVICE

RELATED APPLICATIONS

This application is a continuation-in-part of U.S. patent application Ser. No. 10/251,196, filed on Sep. 20, 2002, which is hereby incorporated by reference. This application claims priority under 35 U.S.C. § 119(e) to U.S. Provisional Application 60/613,466, filed on Sep. 27, 2004, which is hereby incorporated by reference.

BACKGROUND OF THE INVENTION

1. Field of the Invention

This invention relates to microelectromechanical systems devices. In particular it relates to thin film structures in microelectromechanical systems devices and to electromechanical and optical responses of such thin film structures.

2. Description of the Related Art

Today a wide variety of microelectromechanical systems (MEMS) devices may be fabricated using microfabrication techniques. Examples of these MEMS devices include motors, pumps, valves, switches, sensors, pixels, etc.

Often these MEMS devices harness principles and phenomena from different domains such as the optical, electrical and mechanical domains. Such principles and phenomena, while seemingly difficult to harness in the macroscopic world, can become extremely useful in the microscopic world of MEMS devices, where such phenomena become magnified. For example, electrostatic forces which are generally considered to be too weak in the macroscopic world to be harnessed, are strong enough in the microscopic world of MEMS devices to activate these devices, often at high speeds and with low power consumption.

Materials used in MEMS devices are generally selected based on their inherent properties in the optical, electrical, and mechanical domains and the characteristic response to input, such as for example, a driving or actuation voltage.

One problem affecting the fabrication of MEMS devices is that in some cases, a material having a highly desirable response to input, for example an optical response to incident light, may also have an undesirable response to input, for example, an electromechanical response to an actuation or driving voltage. To overcome, or at least reduce, the undesirable response, new materials have to be found or developed often at great expense.

Another problem with the fabrication of MEMS devices is that sometimes, a material selected for its characteristic response may become damaged due to exposure to chemical agents used during a particular microfabrication process. This causes the material to demonstrate less of the characteristic response to the input.

SUMMARY OF THE INVENTION

In one embodiment, the invention provides a MEMS device having a substrate, the device including an electrode layer formed over the substrate, a dielectric layer formed over the electrode layer, a first etch barrier layer formed over the dielectric layer, a cavity located above the first etch barrier, and a moving layer located above the cavity. In further embodiments, the device includes a second etch barrier layer formed over the first etch barrier layer.

In another embodiment, a method of manufacturing a MEMS device is provided, including depositing an electrode layer on a substrate, depositing a dielectric layer over the electrode layer, and depositing an etch stop layer over the dielectric layer. In a further embodiment, the method includes depositing a sacrificial layer over the etch stop layer, depositing a reflective layer of the sacrificial layer, and etching the first sacrificial layer to completely remove the first sacrificial layer, creating an interferometric cavity. In yet further embodiments, a protective layer is formed between the etch stop layer and the first sacrificial layer.

In another embodiment, a method of manufacturing a MEMS device is provided, including depositing an electrode layer on a substrate, depositing a charge-trapping layer over the electrode layer, and depositing a first etch barrier layer over the dielectric layer. In further embodiments, a second etch barrier layer is deposited over the first etch barrier layer.

BRIEF DESCRIPTION OF THE DRAWINGS

FIGS. 10A-10H illustrate an exemplary process for manufacturing a MEMS device;

DETAILED DESCRIPTION OF THE PREFERRED EMBODIMENT

A particular structure or layer within a microelectromechanical systems (MEMS) device may be desirable for its optical response to input in the form of incident light, but may at the same time have an undesirable electromechanical response to input in the form of an actuation or driving voltage. Techniques are disclosed herein to manipulate or control the electromechanical response of the structure or layer, thus at least reducing the undesirable electomechanical response.

Figure 1:
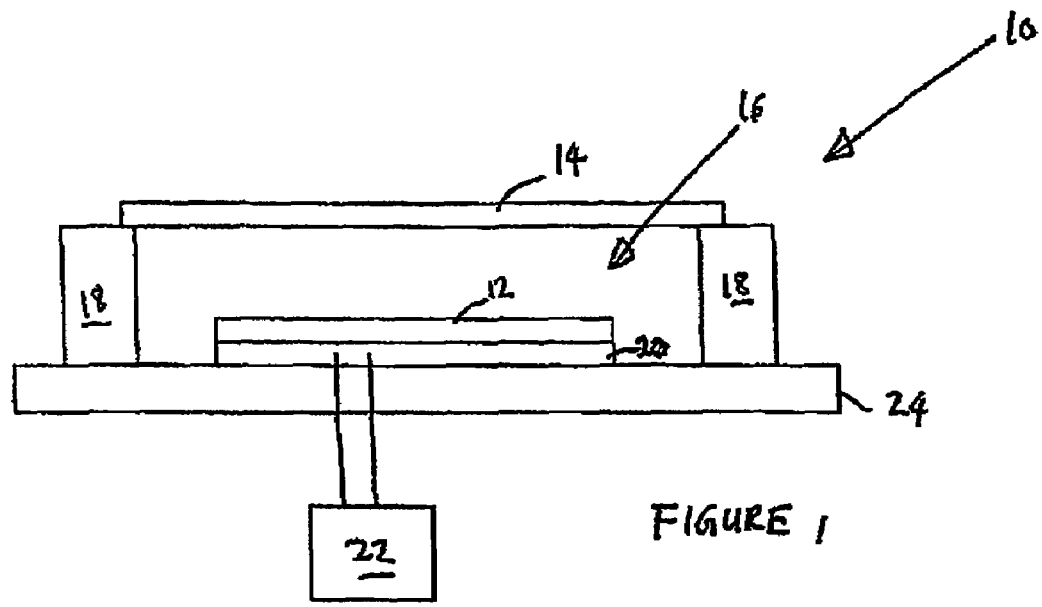
FIGS. 1 and 2 show schematic cross-sections of a MEMS device in an unactuated, and an actuated state respectively.

As an illustrative, but a non-limiting example of a MEMS device, consider the interference modulator (IMOD) device 10 shown in FIG. 1 of the drawings. Referring to FIG. 1, it will be seen that IMOD device 10 has been greatly simplified for illustrative purposes so as not to obscure aspects of the present invention.

Figure 2:
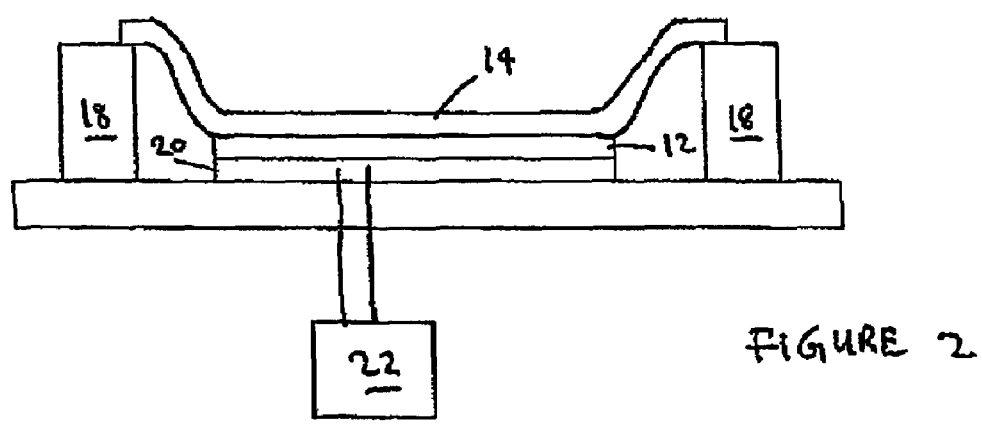

The IMOD device 10 includes a transparent layer 12 and a reflective layer 14 which is spaced from the transparent layer 12 by an air gap 16. The reflective layer 14 is supported on posts 18 and is electrostatically displaceable towards the transparent layer 12 thereby to close the air gap 16. An electrode 20 which is connected to a driving mechanism 22 is used to cause the electrostatic displacement of reflective layer 14. FIG. 1 shows the reflective layer 14 in an undriven or undisplaced condition, whereas FIG. 2 shows the reflective layer 14 in a driven or displaced condition. The reflective layer 14 is generally selected to produce a desired optical response to incident light when it is brought into contact with the transparent layer 12. In one IMOD design, the transparent layer 12 may comprise $SiO_2$. The electrode 20 and the transparent layer 12 are formed on a substrate 24. The substrate 24, the electrode 20, and the transparent layer 12 thereon will be referred to as a "thin film stack."

Typically, a plurality of IMOD devices 10 are fabricated in a large array so as to form pixels within a reflective display. Within such a reflective display, each IMOD device 10 essentially defines a pixel which has a characteristic optical response when in the undriven state, and a characteristic optical response when in the driven state. The transparent layer 12 and the size of the air gap 16 may be selected so that an IMOD within the reflective display may reflect red, blue, or green light when in the undriven state and may absorb light when in the driven state, as described in more detail with respect to FIGS. 10A-10H.

It will be appreciated that during operation of the reflective display, the IMOD devices 10 are rapidly energized, and de-energized in order to convey information. When energized, the reflective layer 14 of an IMOD 10 device is electrostatically driven towards the transparent layer 12, and when the IMOD 10 is de-energized, the reflective layer 14 is allowed to return to its undriven state. In order to keep the reflective layer 14 in its driven condition, a bias voltage is applied to each IMOD device 10.

If an actuation voltage, $V_{actuation}$, defined as a voltage required to electrostatically drive the reflective layer 14 of an IMOD device to its driven condition, as shown in FIG. 2 of the drawings, is equal to a release voltage, $V_{release}$, defined as the voltage at which the reflective layer 14 returns to its undisplaced condition, as is shown in FIG. 1 of the drawings, then it becomes extremely difficult to select an appropriate bias voltage, $V_{bias}$, that can be applied to all of the IMOD's 10 within the reflective display to keep the reflective layers 14 of each respective IMOD device 10 within the reflective display in its driven condition. The reason for this is that each IMOD 10 within the reflective display may have slight variations, for example, variations in a thickness of the layers 12, 14, etc., which, in practice, result in a different release voltage, $V_{release}$, for each IMOD 10. Further, due to line resistance, there will be variations in the actual voltage applied to each IMOD 10, based on its position within the display. This makes it very difficult, if not impossible, to select a value for $V_{bias}$ that will keep the reflective layer 14 of each respective IMOD 10 within the reflective display in its driven condition. This is explained with reference to FIG. 3 of the drawings, which shows the observed hysteresis behavior of the reflective layer 14 of an IMOD 10, in which the transparent layer 12 comprised $SiO_2$.

Figure 3:
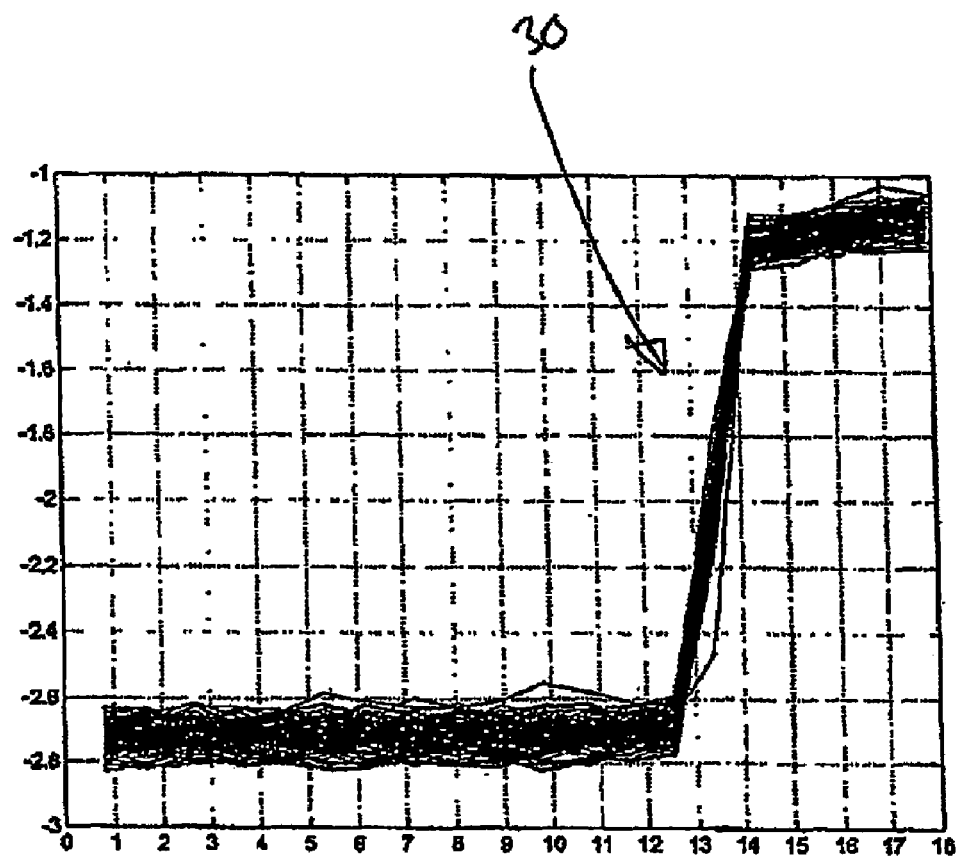
FIG. 3 shows a chart of the actuation and release voltages for the MEMS device of FIGS. 1 and 2.

Referring to FIG. 3, a curve, 30 is shown, which plots applied voltage (in volts) on the X-axis, against optical response measured in the volts on the Y-axis for an IMOD 10 comprising a transparent layer of $SiO_2$. As can be seen, actuation of the reflective layer 14 occurs at about 12.5 volts, i.e., $V_{actuation}$ equals 12.5 volts, and the reflective layer 14 returns to its undriven condition when the applied voltage falls to below 12.5 volts, i.e., $V_{release}$, equals 12.5 volts. Thus, the reflective layer 14 in an IMOD device 10 in which the transparent layer comprises only $SiO_2$ can sometimes demonstrate no hysteresis. Therefore, if the reflective display is fabricated using IMOD devices 10, each comprising a transparent layer 12 and the hysteresis behavior of FIG. 3, it would be impossible to select a value for $V_{bias}$. For example, if $V_{bias}$ is selected to be 12.5 volts, because of variations within the IMOD devices 10 in the reflective display, for at least some of the IMOD devices 10, a $V_{bias}$ of 12.5 volts would fail to keep the reflective layer 14 of those IMOD devices 10 in the driven condition.

In order to select a $V_{bias}$ that is sufficient to keep the reflective layer 14 of a respective IMOD device 10 within a reflective display in its driven condition, it is necessary for each reflective layer 14 of a respective IMOD device 10 within the reflective display to demonstrate some degree of hysteresis, defined as a non-zero difference between the $V_{actuation}$ and $V_{release}$.

It will be appreciated, in view of the disclosure herein, that the electromechanical response of the reflective layer 14 of each IMOD device 10 is determined by the electromechanical properties of the reflective layer 14 as well as the electrical properties of the transparent layer 12. In one particular IMOD device design, the transparent layer 12 comprises $SiO_2$ which gives a desired optical response when the reflective layer 14 is brought into contact therewith. However, the transparent layer 12 comprising $SiO_2$ has a certain electrical characteristic or property (the $SiO_2$ traps negative charge) that affects the hysteresis behavior of the reflective layer 14. Thus, the transparent layer 12 has a desired optical response but an undesirable electromechanical response to a driving or actuation voltage which affects the hysteresis behavior of the reflective layer 14.

In accordance with embodiments of the present invention, the electromechanical behavior of the transparent layer 12 is altered by adding a further layer or layers, replacing $SiO_2$, in the thin film stack. This further layer at least minimizes or compensates for the effect of transparent layer 12 on the hysteresis behavior of the reflective layer 14.

Figure 4:
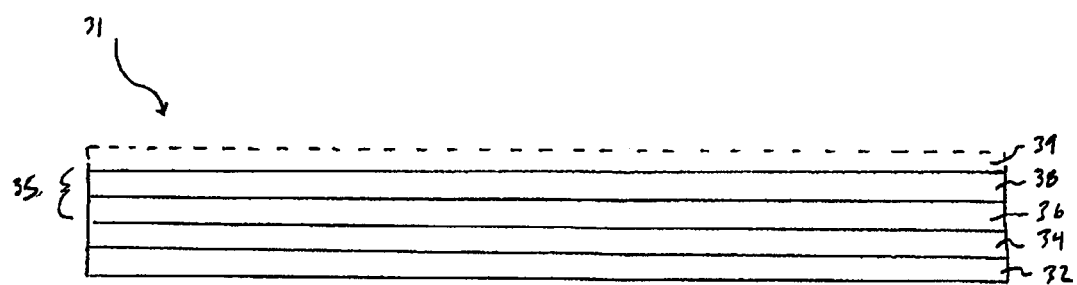
FIG. 4 shows one a thin film stack for a MEMS device, in accordance with one embodiment of the invention.

FIG. 4 illustrates an exemplary thin film stack which can be used to modify the electromechanical response of the device, namely by shifting or otherwise modifying the hysteresis curve. Specifically, FIG. 4 illustrates the formation of a composite layer 35 on a substrate 32 and an electrode 34 by deposition, preferably by CVD. The composite layer 35 comprises a lower layer 36, which may be molybdenum, a silicon-containing material (e.g. silicon, silicon nitride, silicon oxide, etc.), tungsten, or titanium, preferably silicon oxide, which is a dielectric material. In certain embodiments, portions of the lower layer 36 may be removed in a later etching step. The upper, or "stop" layer 38 is preferably a material that is more resistant to a later etching step than the lower layer 36, and may also be a metal (e.g. titanium, aluminum, silver, chromium) or a dielectric material, preferably a metal oxide, e.g. an aluminum oxide. Aluminum oxide may be deposited directly or by deposition of an aluminum layer followed by oxidation. The upper and lower layers 38, 36 may be composed of the same material, but are preferably different materials. In any particular composite layer 35, at least one of the portions 36, 38 is an electrical insulator to avoid shorting the lower electrode 20 to the moving electrode 14 (see FIGS. 1 and 2). The stop layer 38 may be thinner or thicker than the lower layer 36. For example, in an embodiment the stop layer 38 may have a thickness in the range of about 50 angstroms to about 500 angstroms, and the lower layer 36 may have a thickness in the range of about 500 angstroms to about 3000 angstroms. The stop layer 38 serves as the etch stop, preventing removal or other damage to the lower layer 36 located underneath the etch stop 38. The stop layer 38 is more resistant to removal (e.g. etching) than the lower layer 36. In a particular embodiment, discussed in greater detail with respect to FIG. 5, the stop layer 38 is aluminum oxide and the dielectric layer 38 is silicon oxide.

In further embodiments as discussed in greater detail below, a stop layer 38 which is suitable for protecting the lower layer 36 from a given etch process may itself require protection, either from a prior or subsequent etch process or from environmental conditions. In such a case, the deposition of a secondary protective layer 39, shown in phantom in FIG. 4, may advantageously be used to protect the stop layer 38. In certain embodiments, layers 36 and 38 may be deposited, and an etch process may be used during which the stop layer 38 protects dielectric layer 36. The protective layer 39 can then be deposited above the stop layer 38, and may protect it from a subsequent etching process or from environmental conditions. In alternate embodiments, the protective layer 39 can be deposited on the stop layer 38 prior to etching, and protect it from a first etching process which would otherwise have an undesirable effect on the stop layer 38. The protective layer 39 could then be removed by a subsequent etch process, during which the stop layer 38 protects dielectric layer 36. In an exemplary stack, the protective layer 39 comprises $SiO_2$, the stop layer 38 comprises $Al_2O_3$, and the lower layer 36 comprises $SiO_2$. The terms "etch stop," "protective," and "etch barrier" are alternately used herein to describe layers that shield underlying materials from harm during at least one process step, such as an etch step.

Figure 5:
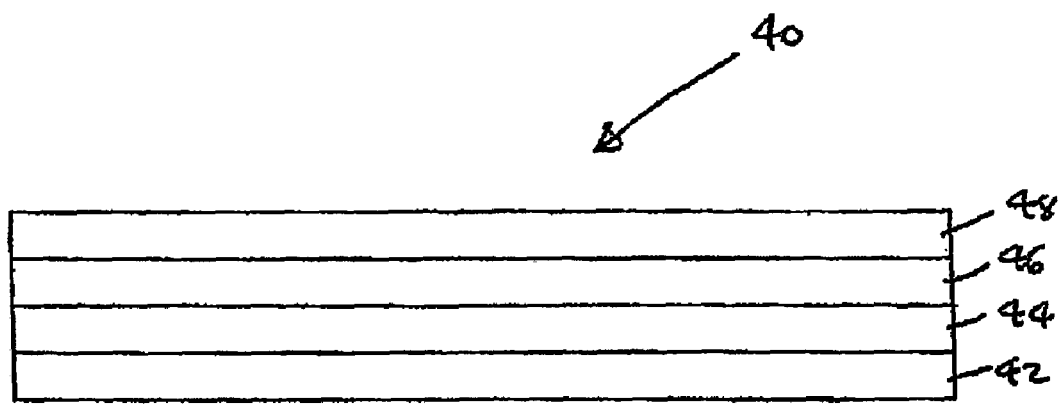
FIG. 5 shows a thin film stack for a MEMS device, in accordance with another embodiment of the invention.

As previously discussed, in one embodiment of the invention, the further layer comprises $Al_2O_3$ which is deposited, in accordance with known deposition techniques, over the transparent layer 12. This results in a thin film stack 40 as shown in FIG. 5 of the drawings, comprising a substrate 42, an electrode 44, an $SiO_2$ reflective layer 46 and an $Al_2O_3$ layer 48.

Figure 6:
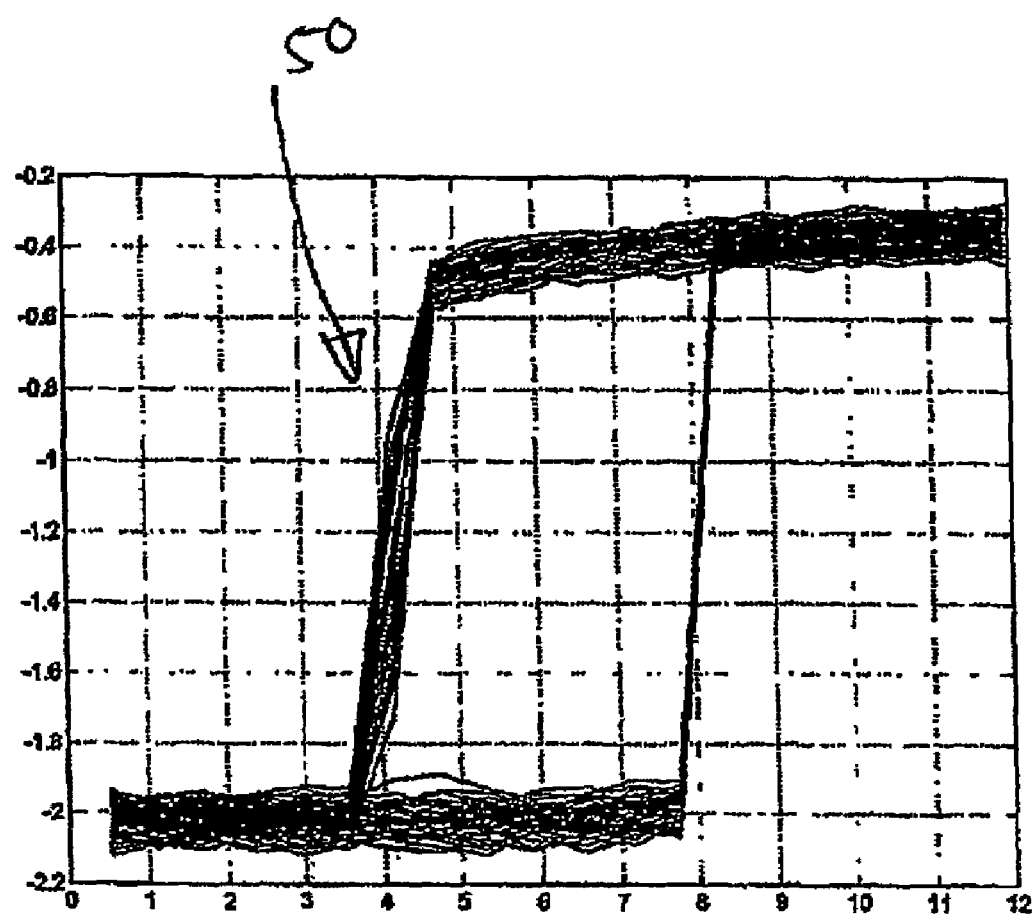
FIG. 6 shows a hysteresis curve for a MEMS device including the thin film stack shown in FIG. 5 of the drawings.

FIG. 6 of the drawings shows a hysteresis curve 50 for an IMOD device 10 comprising the thin film stack 40. As with the hysteresis curve 30 (FIG. 3), the X-axis plots applied voltage in Volts, whereas the Y-axis plots optical response in Volts. The hysteresis curve 50 shows a hysteresis window of 2.8 volts defined as the difference between $V_{actuation}$ (7.8 volts) and $V_{release}$ (5.0 volts). When the individual IMOD's 10 within a reflective display each have a respective reflective layer 14 which demonstrates hysteresis in accordance with the hysteresis curve 50, it will be seen that it is possible to choose a value for the $V_{bias}$ between 5 volts and 7.8 volts which will effectively perform the function of keeping the reflective layer 14 of each respective IMOD device 10 within the reflective display in its driven condition. In a further embodiment of the invention, the thin film stack may be further modified to include an $Al_2O_3$ layer above, as well as below, the transparent layer 12. This embodiment is shown in FIG. 7 of the drawings, where it will be seen that the thin film stack 60 includes a substrate 62, an electrode 64, a first $Al_2O_3$ layer 66, an $SiO_2$ transparent layer 68 and a second $Al_2O_3$ layer 70.

Figure 7:
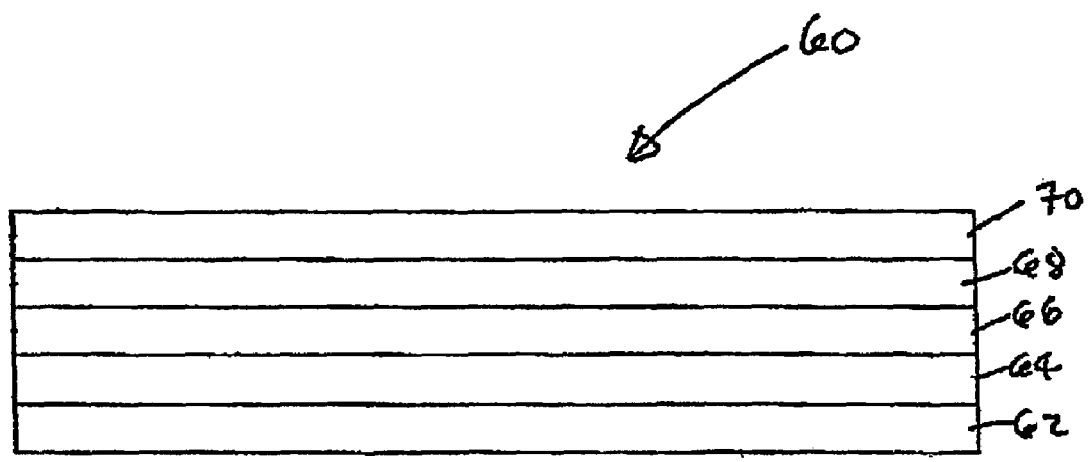
FIG. 7 shows another embodiment of a thin film stack for a MEMS device.
Figure 8:
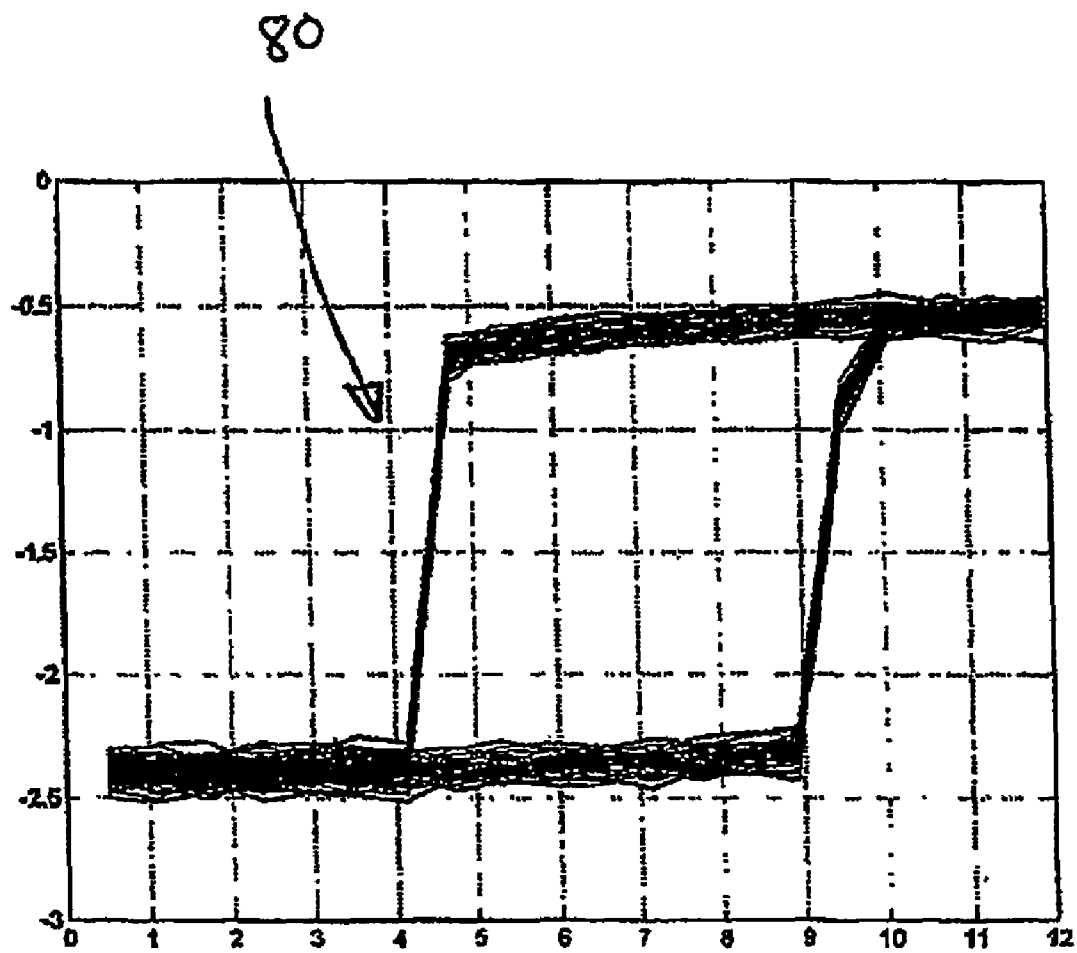
FIG. 8 shows a hysteresis curve for a MEMS device including the thin film stack of FIG. 7 of the drawings.

FIG. 8 of the drawings shows a hysteresis curve 80 for a reflective layer 14 of an IMOD device 10 having the thin film stack 60 shown in FIG. 7 of the drawings. As will be seen, the hysteresis window is now wider, i.e., 4.5 volts, being the difference between $V_{actuation}$ (9 volts) and $V_{release}$ (4.5 volts).

However, other materials that have a high charge trapping density may be used, some of which were discussed above with respect to FIG. 5. These materials include $AlO_x$, which is the off-stoichiometric version of $Al_2O_3$, silicon nitride ($Si_3N_4$), its off-stoichiometric version ($SiN_x$), and tantalum pentoxide ($Ta_2O_5$) and its off-stoichiometric version ($TaO_x$). All of these materials have several orders of magnitude higher charge trapping densities than $SiO_2$ and tend to trap charge of either polarity. Because these materials have a high charge trapping density, it is relatively easy to get charge into and out of these materials, as compared to $SiO_2$, which has a low charge trapping density and has an affinity for trapping negative charge only.

Other examples of materials that have a high charge trapping density include the rare earth metal oxides (e.g., hafinium oxide), and polymeric materials. Further, semiconductor materials doped to trap either negative or positive charge may be used to form the further layer above, and optionally below the $SiO_2$ transparent layer 12.

Thus far, a technique for manipulating the electromechanical behavior of a MEMS device has been described, wherein charge buildup within the MEMS device is controlled by the use of a charge trapping layer which has a high charge trapping density. However, it is to be understood that the invention covers the use of any charge trapping layer to alter or control the electromechanical behavior of a MEMS device regardless of the charge trapping density thereof. Naturally, the choice of a charge trapping layer whether it be of a high, low, or medium charge trapping density will be dictated by what electromechanical behavior for a MEMS device is being sought.

In some embodiments the incorporation of metals, in the form of thin layers or aggregates, provide yet another mechanism for manipulating the charge trapping density of a host film in a MEMS device. Structuring the host film by producing voids or creating a variation or periodicity in its material characteristics may also be used to alter the charge trapping characteristics.

According to another embodiment of the invention, as discussed with respect to FIGS. 4 and 5 above, an IMOD device 10 includes a chemical barrier layer deposited over the transparent layer 12 in order to protect the transparent layer 12 from damage or degradation due to exposure to chemical etchants in the microfabrication process. For example, in one embodiment, the transparent layer 12 which comprises $SiO_2$, is protected by an overlying layer comprising $Al_2O_3$, which acts as a chemical barrier to etchants, for example, $XeF_2$. In such embodiments, it has been found that when the transparent $SiO_2$ layer 12 is protected from the etchants, nonuniformities in the $SiO_2$ are eliminated along with attendant non-uniformities in electromechanical behavior, thus causing the reflective layer 14 within each IMOD device 10 to display hysteresis.

Figure 9A:
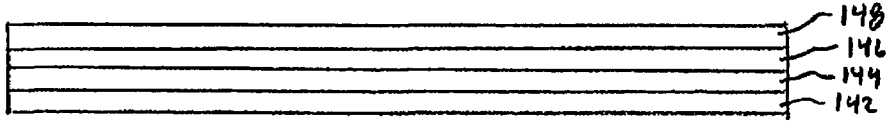
FIGS. 9A-9D show embodiments of a thin film stack for a MEMS device.

As discussed, silicon nitride (stoichiometric or non-stochiometric) may be used as the charge trapping layer. FIG. 9A depicts a thin film stack 140a in which a dielectric layer 146 comprising silicon nitride is formed above an electrode 144 and a substrate 142. Above the layer 146 of silicon nitride, a stop layer 148 of aluminum oxide is formed to protect the silicon nitride during an etching process. Because silicon nitride has a high charge trapping density and is capable of trapping both positive and negative charge, the use of silicon nitride layer 146 will have a different effect on the electromechanical properties of thin film stack 140, namely on the width of the hysteresis curve, than the use of a silicon oxide layer.

Figure 9B:
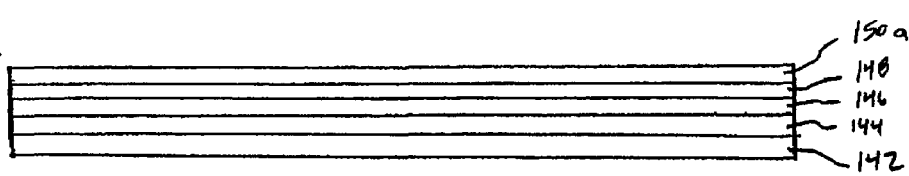

In alternate embodiments, the thin film stack 140a of FIG. 9A can be modified to include a protective layer above the etch stop layer 148. FIG. 9B depicts a thin film stack 140b which includes a protective or second etch barrier layer 150a, which in this embodiment comprises an additional layer of silicon nitride. The protective layer 150a is preferably deposited immediately after the deposition of the first etch stop layer 148, as discussed above. In another embodiment, shown in FIG. 9C, a thin film stack 140c includes a protective or second etch barrier layer 150b, which comprises silicon oxide.

The protective layers 150a or 150b are preferably removed by the same etching process which would be used to remove the sacrificial material to form the cavity. Alternatively, the sacrificial material may be removed by a first etch, and the protective layers 150a or 150b may be removed by a second etch. Protective layers such as layers 150a or 150b may comprise silicon oxide or silicon nitride, as previously discussed, but may also comprise, in alternate embodiments, molybdenum, titanium, amorphous silicon, or any other appropriate material. In certain manufacturing processes, the protective layer 150a or 150b may serve to protect aluminum oxide during patterning of the bulk sacrificial layer, as will be better understood from the discussion below of FIGS. 10A-10H. Because the protective layer 150a,b is preferably removed at the same time as the sacrificial material, the protective layer can also be considered a lower or thin sacrificial layer under an upper or bulk sacrificial material of a different composition.

The first or patterning etch may be selected such that the bulk sacrificial material (e.g., Mo) is etched at a significantly greater rate than the protective layer 150a,b, (e.g., silicon oxide, silicon nitride, amorphous silicon or titanium) and the second or release etch may be selected such that the protective layer 150a,b is etched at a significantly greater rate than the first etch stop layer 148. In addition, the first etch stop layer 148 (e.g., $Al_2O_3$) may be further protected if some portion of the protective layer 150a,b remains above the first etch stop layer 148, minimizing the exposure of the etch stop layer to the etchants.

Figure 9C:
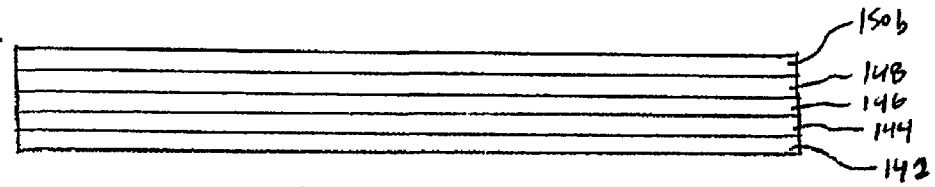

The additional layer of protection provided by the protective layer 150a,b of FIGS. 9B and 9C may advantageously minimize both exposure of the etch stop layer 148 to etchants and variations in the amount of exposure of the etch stop layer 148 to a different etch process. It will be understood that, in many manufacturing processes (such as the sacrificial material patterning process described with respect to FIGS. 10A-10H, below), the protective layer 150a,b, can shield the etch stop layer 148 from the etchants. The etch stop layer 148 can then protect the underlying dielectric layer 146 during a subsequent etch when the second etch barrier layer 150a,b is partially or completely removed, such as the release etch described below with respect to FIGS. 10F-10G.

Figure 9D:
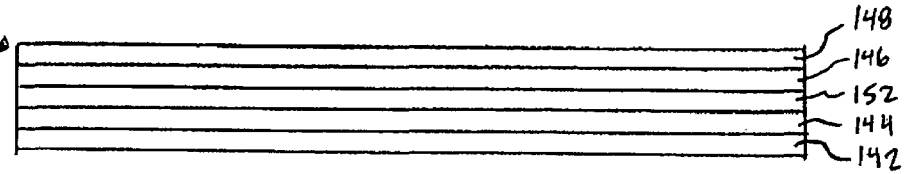

As discussed with respect to FIG. 7, an additional layer of aluminum oxide may be provided beneath the dielectric layer 146. FIG. 9D depicts such an embodiment, in which a thin film stack 140d includes a layer 152 of aluminum oxide beneath the dielectric layer 146, in addition to the etch stop layer 148 above the dielectric layer 146. Such an arrangement may modify the electromechanical characteristics of the device, namely by widening the hysteresis curve. While not illustrated, it will be understood that an additional second etch barrier layer or protective layer can also be provided over the first etch stop layer 148 in the arrangement of FIG. 9D.

FIGS. 10A-10C are cross-sectional views illustrating the initial steps in a process for manufacturing an array of unreleased interferometric modulators (release by removal of the sacrificial material to form interferometric modulators is discussed below with reference to FIGS. 10F-10H). In FIGS. 10A-10H, the formation of an array of three interferometric modulators 200 (red subpixel), 210 (green subpixel) and 220 (blue subpixel) will be illustrated, each of the interferometric modulators 200, 210, 220 having a different distance between the lower electrode/mirror 234 and the upper metal mirror layer 238a, 238b, 238c, as indicated in FIG. 10H, which shows final configurations. Color displays may be formed by using three (or more) modulator elements to form each pixel in the resulting image. The dimensions of each interferometric modulator cavity (e.g., the cavities 275, 280, 285 in FIG. 10H) determine the nature of the interference and the resulting color. One method of forming color pixels is to construct arrays of interferometric modulators, each having cavities of differing sizes, e.g., three different sizes corresponding to red, green and blue as shown in this embodiment. The interference properties of the cavities are directly affected by their dimensions. In order to create these varying cavity dimensions, multiple sacrificial layers may be fabricated and patterned as described below so that the resulting pixels reflect light corresponding to each of the three primary colors. Other color combinations are also possible, as well as the use of black and white pixels.

FIG. 10A illustrates an optical stack 235 similar to those previously discussed (e.g. the optical stack 140b of FIG. 9B) formed by first creating an electrode/mirror layer 234 by depositing an indium tin oxide electrode layer on a transparent substrate 231, then depositing a first mirror layer on the indium tin oxide electrode layer, forming a composite layer which will be referred to as the lower electrode layer 234. In the illustrated embodiment, the first mirror layer comprises chrome. Other reflective metals such as molybdenum and titanium may also be used to form the first mirror layer. In FIG. 10, although the indium tin oxide electrode layer and the first mirror layer are indicated as a single layer 234, it will be understood that the electrode layer 234 comprises a first mirror layer which is formed on the indium tin oxide electrode layer. Such a composite structure may be used in electrode layers elsewhere in the application, as well. The viewing surface 231a of the transparent substrate 231 is on the opposite side of the substrate 231 from the lower electrode layer 234. In a process not shown here, the lower electrode layer 234 is patterned and etched to form electrode columns, rows or other useful shapes as required by the display design. As indicated in FIG. 10A, the optical stack 235 also includes a dielectric layer 237, which may comprise, for example, silicon oxide or a charge trapping layer, such as silicon nitride or other examples listed above, over the lower electrode layer 234, typically formed after the electrode layer 235 has been patterned and etched. In addition, the optical stack 235 includes a first etch barrier layer 236 over the dielectric or charge trapping layer 237. As noted above, the first etch layer 236 preferably comprises aluminum oxide. A protective or second etch stop barrier layer 244 is deposited over the first etch stop layer 236. In various embodiments, the second etch stop or barrier layer 244 comprises silicon oxide, silicon nitride, molybdenum, titanium, or amorphous silicon.

FIG. 10A further illustrates a first pixel sacrificial layer 246a formed by depositing molybdenum (in the illustrated embodiment) over the optical stack 235 (and thus over the first and second etch barriers 236, 244, the dielectric layer 237, and the lower electrode layer 234). In other arrangements, the sacrificial material can be, e.g., titanium or amorphous silicon, but in any event is selected to be different from and selectively etchable relative to the second etch barrier layer 244. The molybdenum of the illustrated embodiment is etched to form the first pixel sacrificial layer 246a, thereby exposing a portion 244a of the second etch barrier, which overlies a corresponding portion of stop layer 236 that will ultimately be included in the resulting green and blue interferometric modulators 210, 220 (FIG. 10H). The thickness of the first sacrificial layer 246a (along with the thicknesses of subsequently deposited layers as described below) influences the size of the corresponding cavity 275 (FIG. 10H) in the resulting interferometric modulator 200. The etchant used to remove a portion of first sacrificial layer 246a is preferably chosen so as to not etch the second etch barrier layer 244, or to etch it at a much lower rate than the sacrificial layer 246a. Thus, although the portion 244a of the second etch barrier is exposed, it is preferably as unaffected by these etchants as is possible. An exemplary etchant is a phosphoric/acetic/nitric acid or "PAN" etchant, which selectively removes Mo relative to the material of the second etch barrier 244 (e.g., silicon oxide, silicon nitride, titanium or amorphous silicon).

FIGS. 10B-10C illustrate forming a second pixel sacrificial layer 246b by deposition, masking and patterning over the exposed portion 244a of the second etch barrier layer 244 and the first pixel sacrificial layer 246a. The second pixel sacrificial layer 246b preferably comprises the same sacrificial material as the first pixel sacrificial layer 246a (molybdenum in this embodiment). Accordingly, the same selective etch chemistry can be employed. The second pixel sacrificial layer 246b is patterned and etched as illustrated in FIG. 10C to expose a portion 244b of the second etch barrier 244 which overlies a corresponding portion of the first etch barrier 236 that will ultimately be included in the resulting blue interferometric modulator 220 (FIG. 10H).

A third pixel sacrificial layer 246c is then deposited over the exposed portion 236b of the stop layer 236 and the second pixel sacrificial layer 246b as illustrated in FIG. 10D. The third pixel sacrificial layer 246c need not be patterned or etched in this embodiment, since its thickness will influence the sizes of all three cavities 275, 280, 285 in the resulting interferometric modulators 200, 210 220 (FIG. 10H). The three deposited pixel sacrificial layers 246a, 246b, 246c do not necessarily have the same thickness.

FIG. 10E illustrates forming a second mirror layer 238 by depositing a layer of aluminum-containing metal over the third pixel sacrificial layer. In the illustrated embodiment, the second mirror layer 238 also serves as an electrode. Although the foregoing description refers to certain exemplary materials for the fabrication of the various layers illustrated in FIG. 10, it will be understood that other materials may also be used, e.g., as described elsewhere in this application.

FIG. 10F illustrates an intermediate stage of the fabrication process, wherein the mirror layer 238 has been etched to form upper mirror portions 238a,b,c, and an additional layer 246d of sacrificial material has been deposited above the mirror portions 238a,b,c. Thus, pockets of sacrificial material 246a, b,c,d exist between and around the optical stack 235 and the upper mirror portions 238a, 238b, 238c. These pockets are separated by support posts 240a,b,c,d. FIG. 10G illustrates removing the sacrificial layers 246a,b,c,d to form the cavities 275, 280, 285, thereby exposing the second etch stop layer 244 underlying the portions 238a,b,c of the mirror layer. In the illustrated embodiment, gaseous or vaporous $XeF_2$ is used as an etchant to remove the molybdenum sacrificial layers 246a,b,c,d. It will be understood that $XeF_2$ may serve as a source of fluorine-containing gases such as $F_2$ and HF, and thus $F_2$ or HF may be used in place of or in addition to $XeF_2$ as an etchant for the preferred sacrificial materials.

The exposed portions 244 of the second etch stop barrier layer 244 and the sacrificial layers 246a,b,c,d will typically be at least partially removed by the release etch. For example, a very thin $SiO_2$ etch stop layer such as 244 may be removed by an $XeF_2$ etchant used to removed a molybdenum sacrificial layer. The same is true of silicon nitride, titanium, and amorphous silicon. Typically, all of the second etch barrier layer 244 is removed from over the first etch barrier layer 236 in the cavity regions 275, 280, 285, as shown in FIG. 10H. The second etch barrier layer 244 located outside of the cavities, underneath the support posts 240a,b,c,d, has not been removed by the etch, as can be seen in FIG. 10H. However, some of the second etch barrier 244 may remain even in the cavity areas after the release etching process (not shown in FIG. 10H). Any remaining second etch barrier 244 is transparent and so thin as to not affect optical properties of the device. Additionally, any remaining second etch barrier 244 will typically have a non-uniform thickness, due to differential exposure to the etchants during removal of differential thicknesses of sacrificial material. In a further embodiment, a second etchant is used to remove the second etch barrier layer 244.

A comparison of FIGS. 10H and 10E illustrates that the size of the cavity 275 (FIG. 10H) corresponds to the combined thicknesses of the three sacrificial layers 246a,b,c. Likewise, the size of the cavity 280 corresponds to the combined thickness of two sacrificial layers 246b,c, and the size of the cavity 285 corresponds to the thickness of the third sacrificial layer 246c. Thus, the dimensions of the cavities 275, 280, 285 vary according to the various combined thicknesses of the three layers 246a,b,c, resulting in an array of interferometric modulators 200, 210, 220 capable of displaying three different colors such as red, green and blue.

As discussed above, portions of the second etch barrier 244 will be exposed to a greater amount of etchant than other portions of barrier 244. This is due to the repeated deposition and etching of bulk sacrificial layer, as discussed above and depicted in FIGS. 10A-10E. While the etchant used in the pattern etching of sacrificial layers 246a and 246b is preferably selected to have as minimal an effect as possible on the second etch barrier layer 244, the etchant may have some undesirable effects on the layer 244. Thus, by the stage of the process depicted in FIG. 10G, immediately prior to removal of the bulk sacrificial material through an etching process, the second barrier layer 244 may have varying properties or height in different locations as a result of variations in etchant exposure. However, because the second barrier layer 244 is thin and transparent or completely removed from the cavities during the subsequent release etch, these variations will have a minimal effect on the optical or electromechanical behavior of the finished MEMS device. Because of the protection provided by this second barrier layer 244, the first barrier layer 236, which in certain embodiments is intended to form a part of the finished MEMS device, will be exposed to only a single etching process (the release etch), which typically is highly selective and will not attack $Al_2O_3$, and variations in the properties of layer 236 can be minimized.

Importantly, the first etch stop layer 236 protects the underlying dielectric (e.g., $SiO_2$) or charge trapping layer (e.g., $Si_3N_4$) during the release etch. The release etch is a prolonged and harmful etch, whose by-products take a long time to diffuse out of the cavities 275, 280, 285. Accordingly, underlying functional layers in the optical stack 235 are protected by the preferred $Al_2O_3$ etch stop layer 236.

Figure 11:
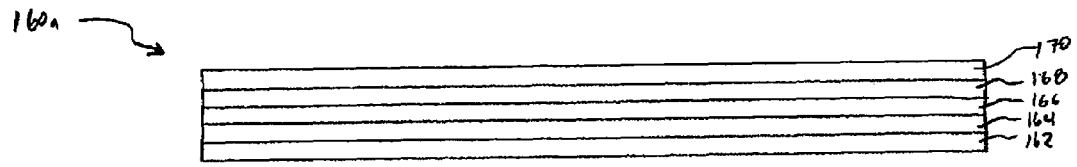
FIGS. 11A and 11B show embodiments of a thin film stack for a MEMS device.
FIG. 11C is a cross section of two interferometric modulators which include a thin film stack in accordance with an embodiment of the invention.
FIG. 11D shows another embodiment of a thin film stack for a MEMS device.
Figure 11:
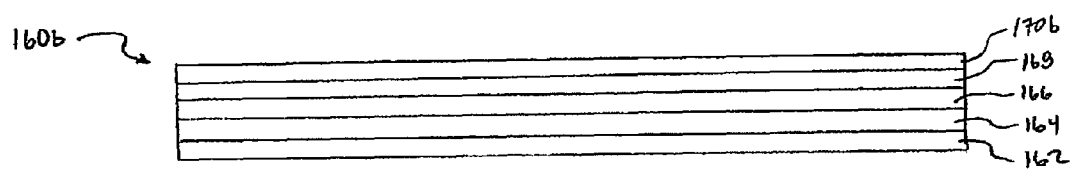
Figure 11:
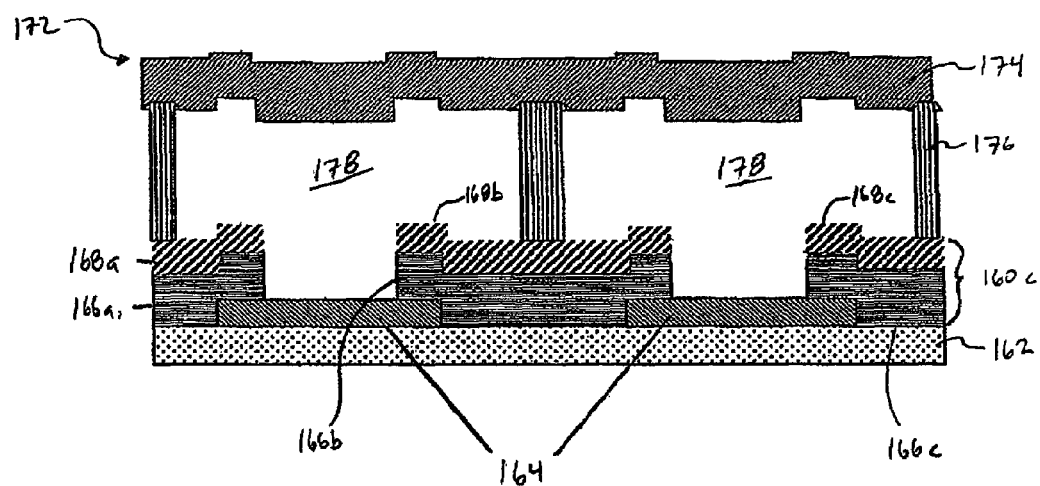

FIGS. 11A and 11B depict thin film stacks in which a silicon dioxide dielectric layer is used, and in which a protective layer is formed above the etch stop layer. With respect to FIG. 11A, a thin film stack 160a includes a dielectric layer 166 of silicon oxide located above an electrode layer 164 and a substrate 162. Above the dielectric layer 166 is located an etch stop layer 168, which preferably comprises aluminum oxide. A protective or second etch barrier layer 170a of silicon oxide is deposited above the first etch stop layer 168. In another embodiment, shown in FIG. 11B, a thin film stack 160b includes a protective or second etch barrier layer 170b, which comprises silicon nitride.

In certain embodiments, one or more portions of the thin film stack 160a,b layer may be selectively removed. In further embodiments, a protective layer may be provided above the remainder of the etch stop layer, such that a thin film structure similar to that discussed with respect to FIGS. 11A and 11B exists over at least part of the electrode. Such an embodiment is described with respect to FIG. 11C.

FIG. 11C depicts a pair of interferometric modulators 172 similar to the modulators 10 of FIGS. 1 and 2, including a thin film stack 160c. The stack 160c comprises a patterened electrode layer 164, a dielectric layer which has been etched to form dielectric portions 166a, 166b, 166b, and an etch stop layer which has been etched to form etch stop portions 168a, 168b, and 168c. The formation of etch stop portions 168a,b,c may be done through the use of a photomask, a first etch to remove the selected portions of the etch stop layer 168, and a subsequent etch to remove the portions of the dielectric layer 166 uncovered by the removal of the etch stop layer 168. A displaceable reflective layer 174 is supported by posts 176, forming interferometric cavities 178.

Those skilled in the art will also appreciate that, in the illustrated embodiment, portions of the cavity may contain a dielectric constant material, e.g., some or all of the interior walls of the cavity 178 may optionally be coated or covered with a dielectric material. Preferably, this dielectric material is a low dielectric constant material. For example, after etching to form the interferometric modulator illustrated in FIG. 11C, a layer of dielectric material may be formed on the bottom electrode 164 over the exposed top surface of the bottom electrode 164. Preferably, any such layer of dielectric material is relatively thin, such that an air gap remains between the top electrode 174 and the dielectric material during both the driven and undriven states. Other interior walls of the cavity 178 that may be coated with a dielectric material include the top electrode 174 and the thin film stack 160c. If the thin film stack 160c includes a top layer of dielectric material, a thin film stack similar to stacks 160a and 160b (of FIGS. 11A and 11B, respectively) will be created. In embodiments in which a low dielectric constant material is used, preferred materials include porous dielectric materials (e.g. aerogels) and modified silicon oxides. U.S. Pat. Nos. 6,171,945 and 6,660,656 describe low dielectric constant materials and methods for making them. Preferred low dielectric constant materials have a dielectric constant of about 3.3 or less, more preferably about 3.0 or less.

Figure 11D:
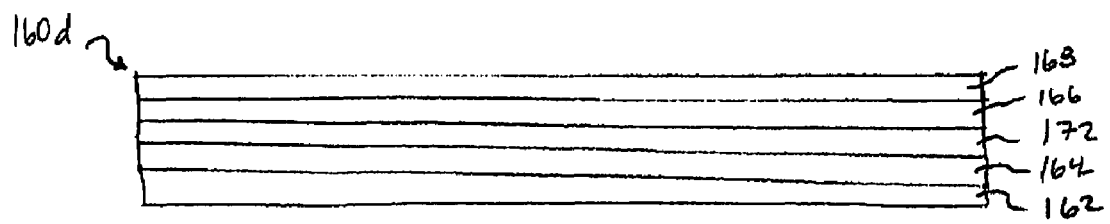

As discussed with respect to FIG. 9D, an additional layer of aluminum oxide may be provided beneath the dielectric layer. FIG. 11D depicts an embodiment, similar to that depicted in FIG. 9D, in which a thin film stack 160d includes a layer 172 of aluminum oxide beneath the silicon oxide dielectric layer 166, in addition to the etch stop layer 168 above the dielectric layer. As previously discussed, the inclusion of this additional layer may modify the electromechanical characteristics of the device, such as by widening the hysteresis curve.

As discussed with respect to FIG. 10, the deposition of a charge-trapping layer is preferably done after the patterning of the electrode layer. For simplicity, many of the stacks depicted and discussed in the present application depict a continuous electrode layer. However, it will be understood that these are figures are merely schematics, which are not to scale, and which represent those portions of particular thin film stacks which are located over electrodes. The formation of thin film stacks which include patterned electrodes will also result in areas of the stack in which no electrode layer exists between a portion of another layer (such as a silicon oxide layer or a charge trapping layer, e.g. silicon nitride) and the substrate.

Figure 12A:
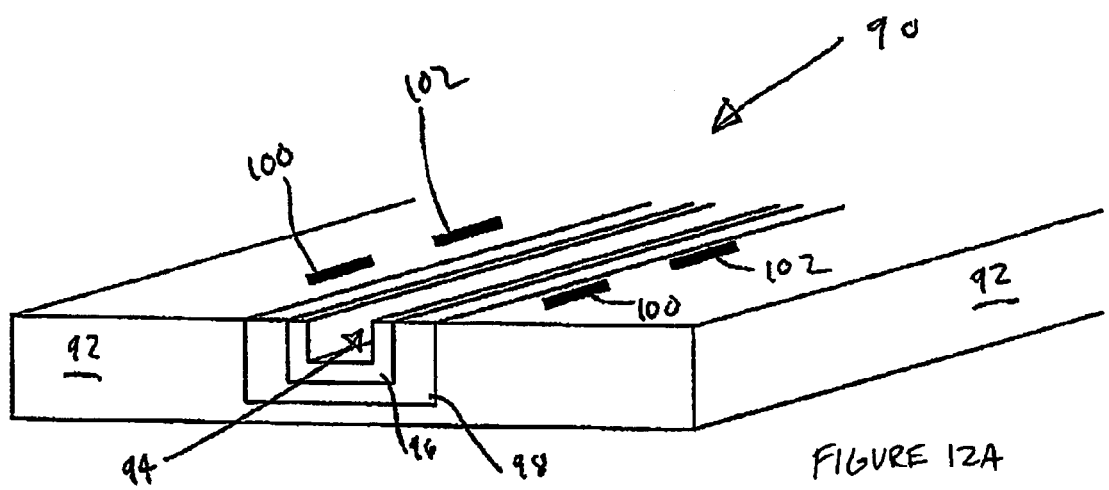
FIG. 12A shows a block diagram of an electrostatic fluid flow system within a MEMS device in accordance with one embodiment of the invention.
Figure 12B:
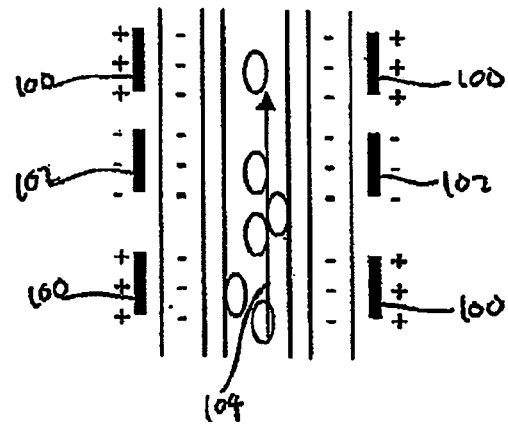
FIG. 12B is a schematic, isometric view of the fluid flow system of FIG. 8a illustrating its principle of operation.

FIGS. 12A and 12B show another application within a MEMS device wherein a charged trapping layer is used to control the electromagnetic behavior of a structure within the MEMS device.

Referring to FIG. 12A, reference numeral 90 generally indicates a portion of an electrostatic fluid flow system. The electrostatic fluid flow system includes a substrate 92 within which is formed a generally U-shaped channel 94. The channel 94 includes an inner layer 96 of a first material which is selected, for example, because of its chemical and mechanical properties, for example, the material may be particularly wear-resistant, and may demonstrate little degradation due to the flow a fluid within the channel. The channel 94 also includes an outer layer 98 which is selected for its charge-trapping properties, as will be explained in greater detail below.

The electrostatic fluid flow system 90 also includes pairs of electrodes 100 and 102 which are selectively energized to cause displacement of charge particles within a fluid in the channel 94 in the direction indicated by the arrow 104 in FIG. 8b of the drawings. In one embodiment, the outer layer 98 traps charge in the fluid thereby to provide greater control of fluid flow within the system 101. In another embodiment, the layer 98 may trap charge in order to eliminate or to reduce hysteresis effects.

Figure 13:
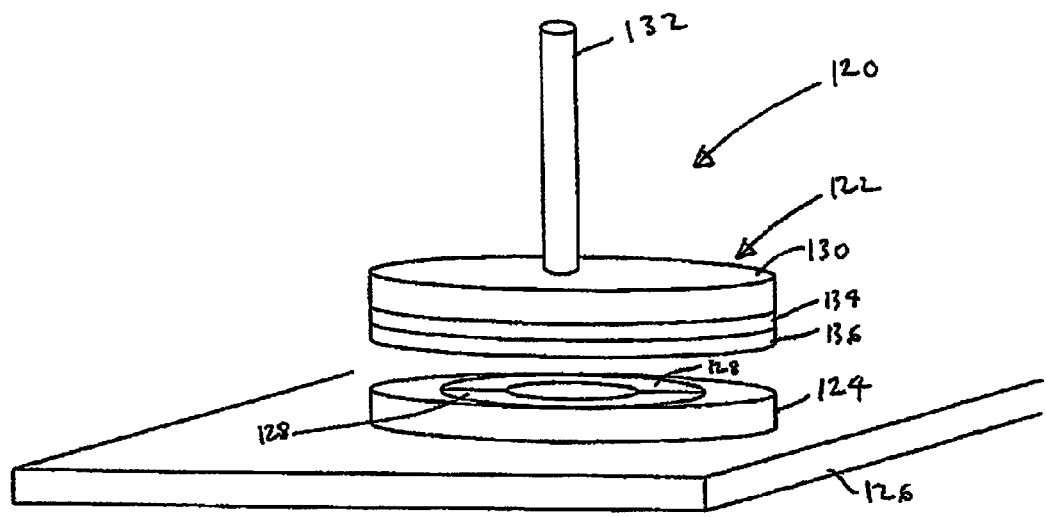
FIG. 13 schematically shows another embodiment of a MEMS device in accordance with the invention.

Referring now to FIG. 13 of the drawings, another application of using a charge-trapping layer to alter the electromechanical behavior of a structure within a MEMS device is shown. In FIG. 13, reference numeral 120 generally indicates a motor comprising a rotor 122 which is axially aligned and spaced from a stator of 124. As can be seen, the stator 124 is formed on a substrate 126 and includes electrodes 128, which, in use, are energized by a driving mechanism (not shown). The rotor 122 includes a cylindrical portion 130 which is fast with a spindle 132. The rotor 122 may be of a material that may be selected for its mechanical properties, including resistance to wear, but may have undesirable electrical properties in response to input, such as when the electrodes 128 are energized in order to cause rotation of the rotor 122. In order to compensate for these undesirable electrical properties, layers 134 and 136 are deposited on the rotor 122 in order to effectively act as a charge trapping layer to alter the electromechanical behavior of the rotor 122.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A MEMS device having a substrate comprising:
an electrode layer formed over the substrate;
a dielectric layer formed over the electrode layer, wherein the dielectric layer comprises silicon oxide;
a first etch barrier layer formed over the dielectric layer;
a cavity located above the first etch barrier;
a moving layer located above the cavity; and a fourth layer formed between the electrode layer and the first dielectric layer, said fourth layer comprising aluminum oxide.

2. The device of claim 1, wherein the first etch barrier layer comprises aluminum oxide.

3. The device of claim 1, wherein the device is an interferometric modulator.

4. The device of claim 1, additionally comprising a second etch barrier layer formed over the first etch barrier layer.

5. The device of claim 4, wherein the second etch barrier layer comprises silicon oxide.

6. The device of claim 4, wherein the second etch barrier layer comprises silicon nitride.

7. The device of claim 4, wherein the second etch barrier layer comprises titanium.

8. The device of claim 4, wherein the second etch barrier layer comprises molybdenum.

9. The device of claim 4, wherein the second etch barrier layer comprises amorphous silicon.

10. The device of claim 4, wherein the second etch barrier layer has a varying thickness over the surface of the first etch barrier layer.

11. The device of claim 10, wherein the second etch barrier covers only a portion of the first etch barrier layer.

* * * * *